(12) United States Patent
Nakayama

(10) Patent No.: US 7,320,603 B2
(45) Date of Patent: Jan. 22, 2008

(54) FLAT CONNECTOR

(75) Inventor: Koji Nakayama, Seki (JP)

(73) Assignee: Brother Kabushiki Kaisha, Nagoya-shi, Aichi-ken (JP)

( * ) Notice: Subject to any disclaimer, the term of this patent is extended or adjusted under 35 U.S.C. 154(b) by 0 days.

(21) Appl. No.: 11/674,181

(22) Filed: Feb. 13, 2007

(65) Prior Publication Data

US 2007/0128924 A1    Jun. 7, 2007

Related U.S. Application Data

(62) Division of application No. 11/167,288, filed on Jun. 28, 2005.

(30) Foreign Application Priority Data

Jun. 28, 2004    (JP)    ............................. 2004-190205

(51) Int. Cl.
  *H01R 12/00*    (2006.01)
(52) U.S. Cl. ............................. 439/67; 29/842; 29/844
(58) Field of Classification Search .................. 439/67, 439/77; 29/842, 844
  See application file for complete search history.

(56) References Cited

U.S. PATENT DOCUMENTS

| 5,726,432 | A | * | 3/1998 | Reichardt | .................... 235/441 |
| 5,992,976 | A | | 11/1999 | Kimura et al. | |
| 6,630,839 | B1 | * | 10/2003 | Haseyama et al. | .......... 324/765 |
| 7,232,315 | B2 | * | 6/2007 | Uchida et al. | ................. 439/67 |
| 2004/0070010 | A1 | | 4/2004 | Makoto et al. | |

FOREIGN PATENT DOCUMENTS

| EP | 0562340 | A | 9/1993 |
| EP | 0602609 | A1 | 12/1993 |
| EP | 0861725 | A2 | 2/2007 |
| JP | 410360 | | 1/1992 |
| JP | 04-033550 | * | 3/1992 |
| JP | 2004114307 | A | 4/2004 |
| JP | 2004114338 | A1 | 4/2004 |

OTHER PUBLICATIONS

European Search Report dated Oct. 18, 2005 in Application No. 05254027.5-2304.

* cited by examiner

*Primary Examiner*—Tho D. Ta
(74) *Attorney, Agent, or Firm*—Banner & Witcoff, Ltd

(57) ABSTRACT

The ink jet head is provided with a piezo-electric sheet having a plurality of contacts distributed on a surface thereof. A flat connector is fixed so as to cover the surface of the piezo-electric sheet. A plurality of conductive spots and a plurality of conductive lines are formed on a surface of the flat connector. One of each of the conductive lines is connected with one of each of the conductive spots, and the plurality of conductive spots is disposed with the same distributive pattern as the plurality of contacts. The flat connector is provided with a sheet formed of an insulating material, and is provided with a plurality of projections corresponding to the conductive spots. At least a distal end of each of the projections is covered with one of the conductive spots. The flat connector and the piezo-electric sheet are fixed such that the conductive spots make contact with the contacts of the piezo-electric sheet. Portions of the flat connector having projections are thinner than the surrounding area of the flat connector.

3 Claims, 18 Drawing Sheets

(a)

(b)

(c)

(a)

(b)

(c)

(a)

(b)

(c)

(a)

(b)

(c)

(a)

(b)

(a)

(b)

(c)

(a)

(b)

FLAT CONNECTOR

CROSS-REFERENCE TO RELATED APPLICATION

This application is a divisional of prior application Ser. No. 11/167,288, filed Jun. 28, 2005, which claims priority to Japanese Patent Application No. 2004-190205, filed on Jun. 28, 2004. The entire disclosures of the prior applications are hereby incorporated by reference herein.

BACKGROUND OF THE INVENTION

1. Field of the Invention

The present invention relates to a flat connector for transmitting driving power to an electric device, and a method of manufacturing the flat connector. The present invention also relates to an ink jet head that uses the flat connector, and a method of manufacturing the ink jet head.

2. Description of the Related Art

An ink jet printer provided with an ink jet head and a flat connector is taught in Japanese Laid Open Utility Model Publication No. 1992-33550 (H4-33550). Ink is stored within the ink jet head. The ink jet head is provided with piezo-electric elements and contacts. The piezo-electric elements apply pressure to the ink. The contacts are connected with the piezo-electric elements, and are distributed on a surface of the ink jet head. The flat connector is provided with an insulating base film, and a conductive pattern formed on a surface of the base film. The conductive pattern has conductive spots and conductive lines. Each conductive line is connected with each conductive spot, respectively. The conductive spots of the flat connector are located opposite the contacts of the ink jet head.

Each conductive spot is formed as a projection that protrudes towards one of the contacts of the ink jet head. The flat connector is pressed against the ink jet head by a resilient member, thus connecting the conductive spots of the flat connector—these conductive spots being formed as projections—with the contacts of the ink jet head. A connection is thus completed to transmit driving power to the piezo-electric elements of the ink jet head. The base film of the flat connector is flexible, and is termed an FPC (Flexible Printed Circuit).

In the aforementioned ink jet printer, the base film of the flat connector is extremely thin, and it is therefore difficult to handle. That is, the flat connector bends readily when the conductive spots of the flat connector are made to overlap with the contacts of the ink jet head, and therefore the flat connector is difficult to handle. The flat connector can be handled more easily if the base film is thicker. However, when a thick base film is used and the projections of conductive spots are formed, each of these projections becomes larger, and it is therefore difficult to distribute the conductive spots with a high density. Further, the projecting parts of the conductive spots lose flexibility due to the base film being thicker. As a result, when there is unevenness among the heights of the projections of the flat connector or among the heights of the contacts of the ink jet head, there may be locations where the conductive spots of the flat connector do not make contact with the contacts of the ink jet head.

BRIEF SUMMARY OF THE INVENTION

An aim of the present invention is to present a flat connector which can be handled easily and in which conductive spots can be formed with a high density. The present invention presents a new flat connector and a method for its manufacture. Further, the present invention presents a new ink jet head and a method for its manufacture.

The method for manufacturing the flat connector of the present invention includes a step of forming, within a sheet made of an insulating material, a plurality of portions thinner than the area surrounding these thinner portions. The present method also includes a step of forming a plurality of conductive spots at a first surface of the sheet. In this case, at least a portion of each conductive spot is located within one of the thinner portions. The present method also includes a step of forming a plurality of projections by pressing the sheet at each of the thinner portions from a second surface side to the first surface side of the sheet. The projections are thus formed at the first surface of the sheet. At least a distal end of each projection is covered by one of the conductive spots for making contact with the contacts of the electric device.

In the present method, the step of forming the thinner portions may be performed before the step of forming the plurality of conductive spots, or the step of forming the plurality of conductive spots may be performed before the step of forming the thinner portions.

Using the present method, it is possible to manufacture a flat connector wherein projections with a small surface size (or plane size) can be formed and conductive spots can be distributed with a high density even though a sheet having a thickness that allows easy handling is being used.

The flat connector of the present invention includes a sheet made of an insulating material, a plurality of projections being formed at a first surface of the sheet and a plurality of recesses formed at a second surface of the sheet. Each recess corresponds to each projection. A plurality of conductive spots is formed at the first surface of the sheet. Each of the conductive spots covers at least a distal end of one of the projections. Portions of the sheet that form the distal ends of the projections are located within portions of the sheet that are thinner than the surrounding area.

With the aforementioned flat connector, portions of the sheet forming projections are thin and flexible, and consequently even if there is unevenness among the heights of the projections of the flat connector or among the heights of the contacts of the ink jet head, the conductive spots of the flat connector and contacts of the ink jet head make contact reliably. Electrical connection can thus be made more reliable.

An ink jet head of the present invention includes a piezo-electric actuator and a flat connector. The piezo-electric actuator has a piezo-electric layer and a plurality of contacts distributed on a surface of the piezo-electric layer. The flat connector has the same configuration as described above. The piezo-electric actuator and the flat connector are fixed so that each of the conductive spots of the flat connector makes contact with one of the contacts of the piezo-electric actuator. Electrical connection between the piezo-electric actuator and the flat connector is reliable.

The ink jet head of the present invention can be manufactured by the following method.

The present method includes a step of forming, within a sheet made of insulating material, a plurality of portions thinner than the area surrounding these thinner portions, a step of forming a plurality of conductive spots and conductive lines at a first surface of the sheet, a step of forming a plurality of projections by pressing the sheet at each of the thinner portions from a second surface side to the first surface side of the sheet, and a step of fixing the flat connector and the piezo-electric actuator. In the step of forming the conductive spots and conductive lines, one conductive line is formed to correspond to one conductive spot, and the conductive line is connected with this conductive spot. At least a portion of each of the conductive spots is located within one of the thinner portions. In this method, the sheet is pressed from the second surface side to the first surface side to form the projections. At least the distal end of each of the projections that have been formed in this manner is covered by one of the conductive spots for making contact with the contacts of the electric device. In the step of fixing the piezo-electric actuator and the flat connector, the piezo-electric actuator and the flat connector are fixed such that each of the conductive spots of the flat connector makes contact with one of the contacts of the piezo-electric actuator.

Using the present method, it is possible to manufacture the flat connector having projections distributed with a high density, each projection having a small surface size, even if the base film is thick. The flat connector can be handled easily. Using the present method, it is possible to manufacture the ink jet head easily.

BRIEF DESCRIPTION OF THE DRAWINGS

FIG. 7(a) shows an enlarged view of a portion enclosed by the dashed line in FIG. 6. FIG. 7(b) shows a plan view of an individual electrode.

FIG. 11(a) shows a state where a photo-resist has been formed on an upper surface of a base film. FIG. 11(b) shows a state where a thinner portion has been formed on the base film. FIG. 11(c) shows a state where the photo-resist has been removed from the base film.

FIG. 12(a) shows a state where copper foil has been formed on the entirety of a lower surface of the base film. FIG. 12(b) shows a state where a photo-resist has been formed on the copper foil of the base film and etching of the copper foil has then been performed. FIG. 12(c) shows a state where the photo-resist has been removed and a conductive pattern has been formed on the base film.

FIG. 13(a) shows a state where the copper foil has been formed on the entirety of the lower surface of the base film. FIG. 13(b) shows a state where the photo-resist has been formed on the copper foil of the base film and etching of the copper foil has then been performed. FIG. 13(c) shows a state where the photo-resist has been removed and the conductive pattern has been formed on the base film.

FIG. 14(a) shows a state where the photo-resist has been formed on the upper surface of the base film. FIG. 14(b) shows a state where the thinner portion has been formed on the base film. FIG. 14(c) shows a state where the photo-resist has been removed from the base film.

FIG. 15(a) shows a state prior to the base film being exposed to a laser. FIG. 15(b) shows a state where the base film is exposed to the laser and the thinner portion has been formed.

FIG. 16(a) shows a state where the base film has been mounted above a female mold. FIG. 16(b) shows a state where the base film has been pressed by a male mold. FIG. 16(c) shows the FPC that has been removed from the male and female molds.

FIG. 17(a) shows a state where a protruding part and a land are disposed overlapped in opposing locations. FIG. 17(b) shows a state where a contact part has been connected with the land.

DETAILED DESCRIPTION OF THE INVENTION

Figure 1:
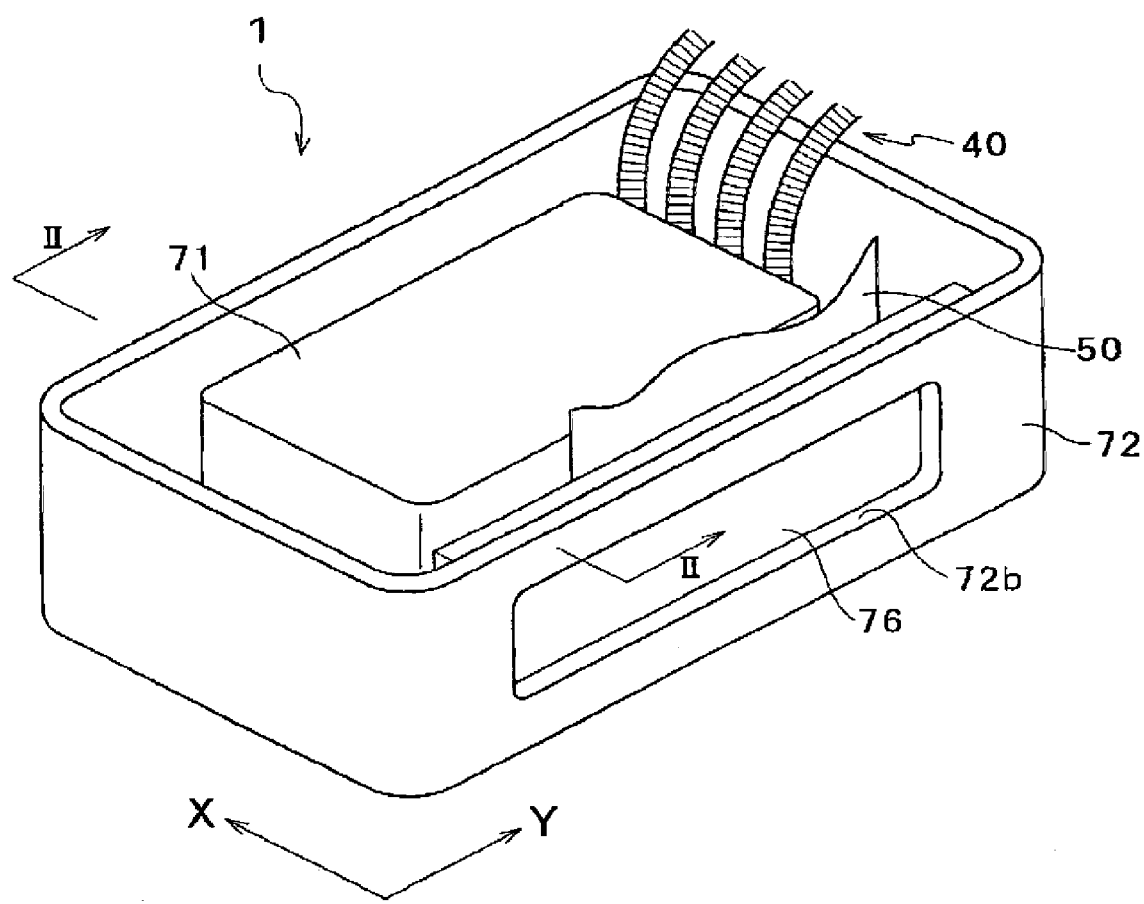
FIG. 1 shows a diagonal external view of an ink jet head of a representative embodiment of the present teachings.
Figure 2:
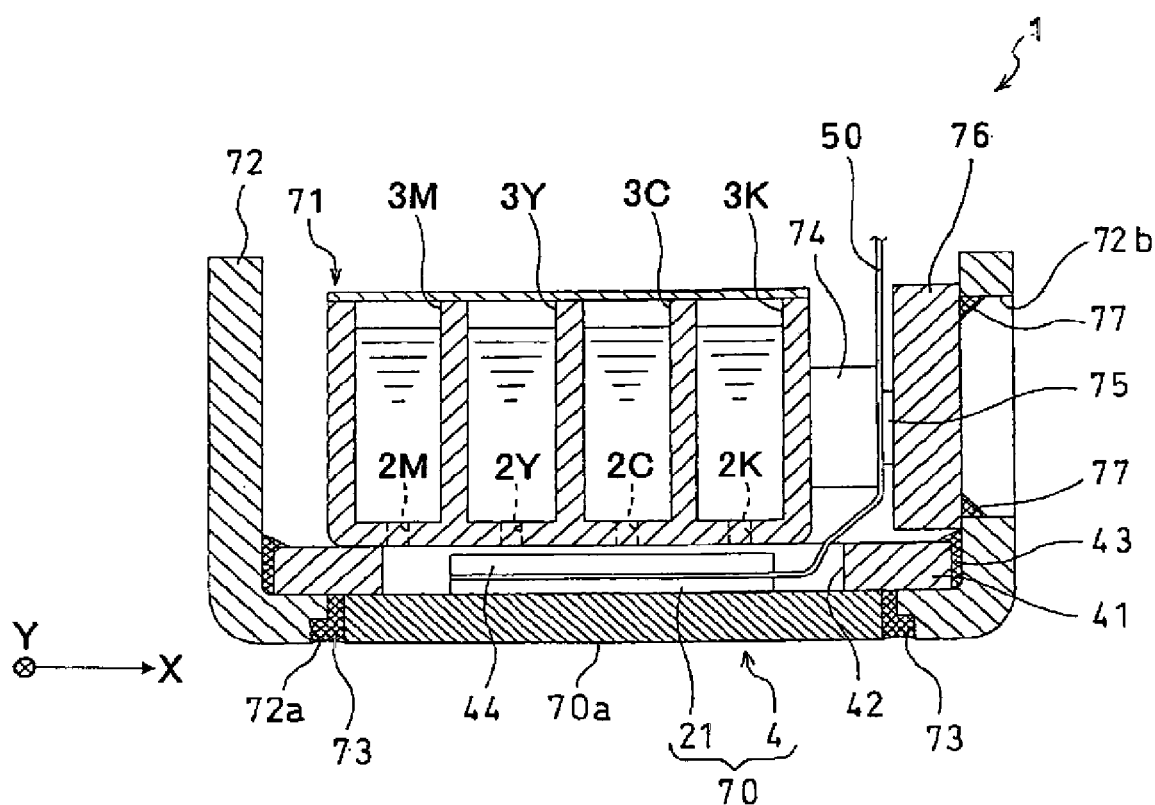
FIG. 2 shows a cross-sectional view along the line II-II of FIG. 1.
Figure 3:
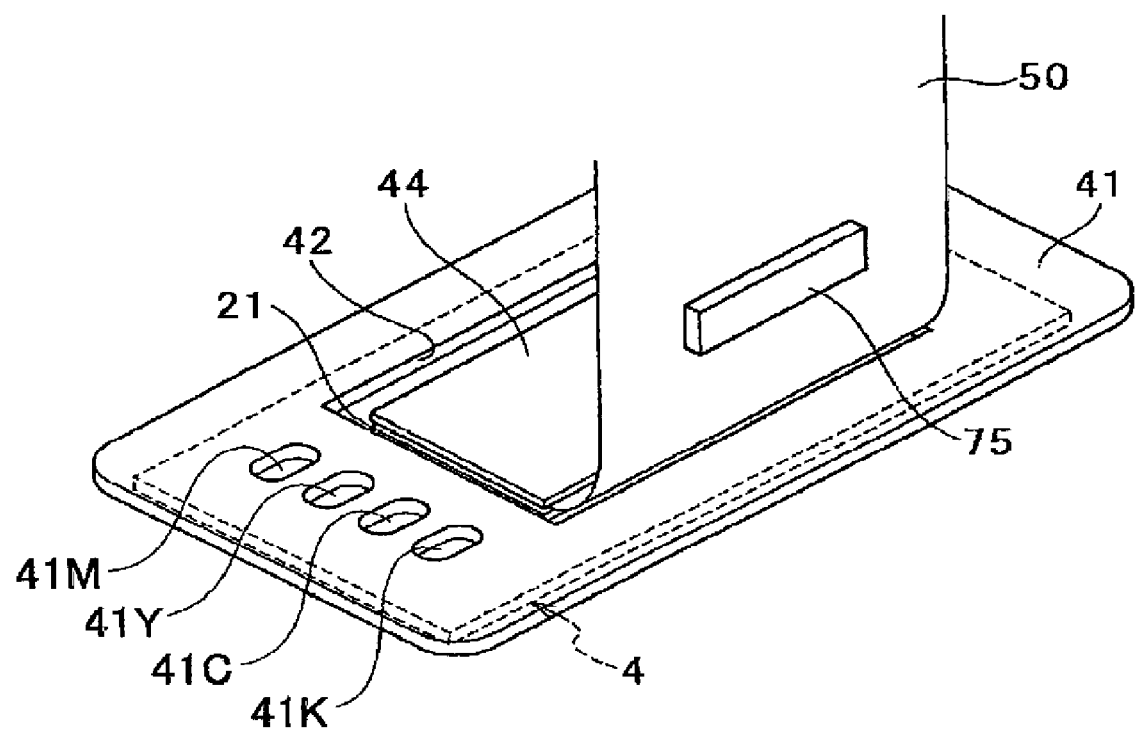
FIG. 3 shows a diagonal view showing a state where a reinforcing sheet makes contact with a head main body shown in FIG. 2.

A preferred representative embodiment of the present invention will be described below with reference to the drawings. FIG. 1 shows a diagonal external view of an ink jet head of a representative embodiment of the present teachings. FIG. 2 shows a cross-sectional view along the line II-II of FIG. 1, and shows a state where a head main body is assembled in a holder. FIG. 3 shows a diagonal view showing a state where a reinforcing sheet makes contact with the head main body shown in FIG. 2.

An ink jet head 1 is used in a serial ink jet printer (not shown), and discharges four colors of ink (magenta, yellow, cyan, and black) onto paper, thus performing printing. The paper is delivered in a sub scanning direction shown by the arrow Y, and the ink jet head 1 moves in a main scanning direction shown by the arrow X.

As shown in FIG. 2, the ink jet head 1 is provided with an ink tank 71, a head main body 70 disposed below the ink tank 71, an FPC (Flexible Printed Circuit) 50 bonded to the head main body 70, and a holder 72. The head main body 70 is an electric device having a plurality of contacts distributed on an upper surface thereof. The FPC 50 is a flat connector for supplying driving power to the electric device.

Contained in the ink tank 71 are: an ink chamber 3M for storing magenta ink, an ink chamber 3Y for storing yellow ink, an ink chamber 3C for storing cyan ink, and an ink chamber 3K for storing black ink. The ink chambers 3M, 3Y, 3C, and 3K are aligned in the main scanning direction shown by the arrow X. Each of the four ink chambers 3M, 3Y, 3C, and 3K is connected with a corresponding ink cartridge (not shown) via a tube 40 (see FIG. 1), and ink of each color is supplied from the ink cartridges to the ink chambers 3M, 3Y, 3C, and 3K. An ink discharge port 2M is formed at a base part of the ink chamber 3M, an ink discharge port 2Y is formed at a base part of the ink chamber 3Y, an ink discharge port 2C is formed at a base part of the ink chamber 3C, and an ink discharge port 2K is formed at a base part of the ink chamber 3K.

As shown in FIG. 2, the ink tank 71 is fitted together with a reinforcing sheet 41 that, from a plan view, is rectangular in shape. As shown in FIG. 3, four through holes 41M, 41Y, 41C, and 41K that join respectively with the ink discharge ports 2M, 2Y, 2C, and 2K are formed in the reinforcing sheet 41. From a plan view, the through holes 41M, 41Y, 41C, and 41K have an oval shape. The reinforcing sheet 41 is fixed to the approximately rectangular parallelepiped shaped holder 72 using an ultraviolet hardener 43.

An opening 42, which is rectangular from a plan view, is formed in the reinforcing sheet 41 (see FIG. 3). As shown in FIG. 2, the head main body 70 is fixed to the reinforcing sheet 41. An actuator unit 21 (a piezo-electric actuator, to be described) is located within the opening 42.

Figure 4:
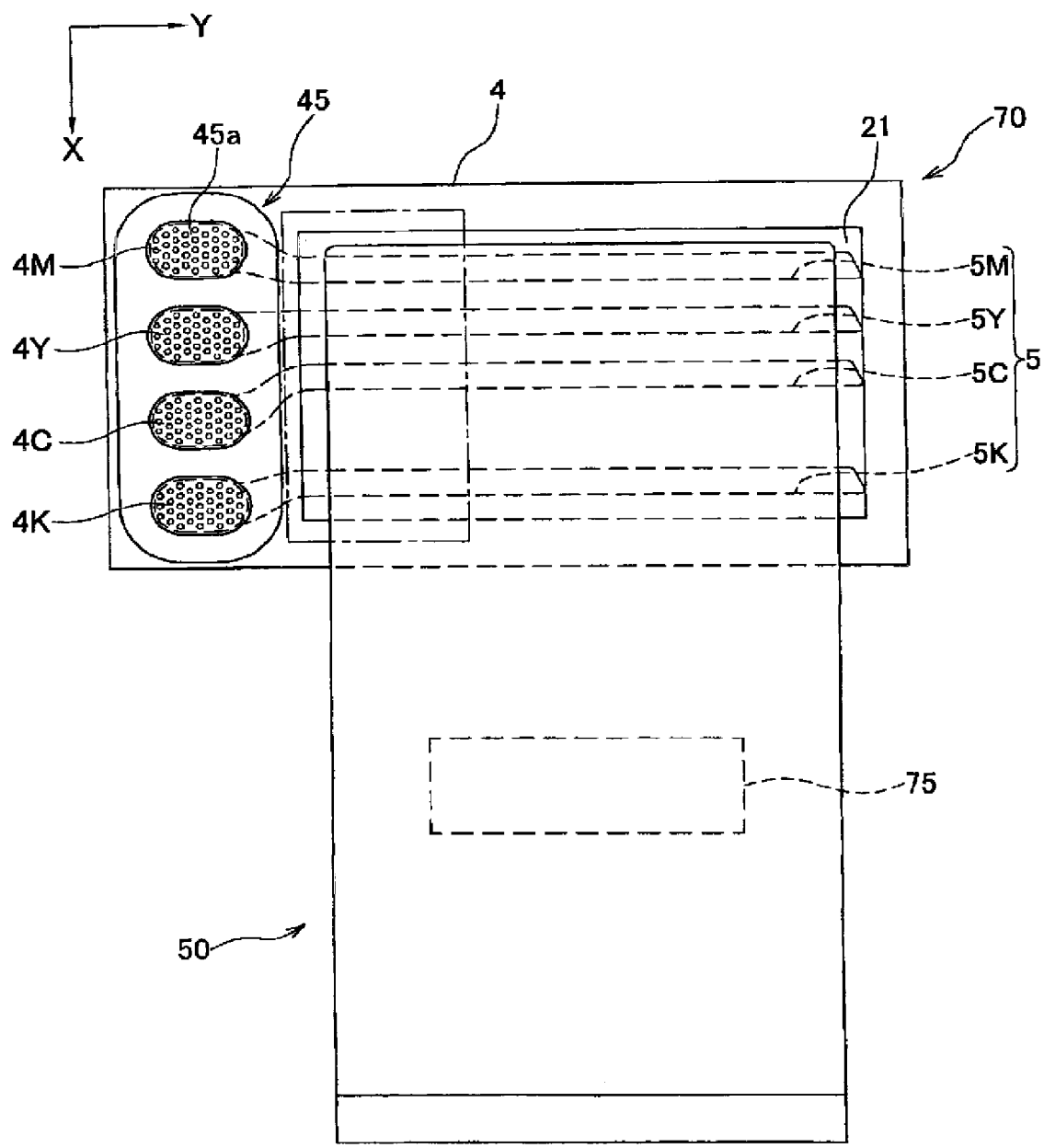
FIG. 4 shows a plan view of the head main body shown in FIG. 2.

The head main body 70 includes a passage unit 4 and the actuator unit 21. An ink passage for each ink color is formed within the passage unit 4. The actuator unit 21 is bonded to an upper surface of the passage unit 4 by means of an epoxy-type thermosetting adhesive. The passage unit 4 and the actuator unit 21 are structures in which a plurality of thin sheets are layered and are bonded together. The passage unit 4 and the actuator unit 21 are disposed below the ink tank 71. As shown in FIG. 4, four inlet ports 4M, 4Y, 4C, and 4K are formed in the upper surface of the passage unit 4. From a plan view these inlet ports 4M, 4Y, 4C, and 4K have an oval shape, and join respectively with the through holes 41M, 41Y, 41C, and 41K.

As shown in FIG. 3, the passage unit 4 is connected with the reinforcing sheet 41 such that the inlet ports 4M, 4Y, 4C, and 4K formed in the passage unit 4 join respectively with the through holes 41M, 41Y, 41C, and 41K formed in the reinforcing sheet 41. By means of this configuration, the four types of ink within the ink tank 71 pass through the four ink discharge ports 2M, 2Y, 2C, and 2K formed in the ink tank 71, the four through holes 41M, 41Y, 41C, and 41K formed in the reinforcing sheet 41, and are delivered into the passage unit 4 from the four inlet ports 4M, 4Y, 4C, and 4K formed in the passage unit 4.

As shown in FIG. 2, the head main body 70 is fixed to the holder 72 in a state where an ink discharge face 70a of the passage unit 4 protrudes to the exterior. Space between the passage unit 4 and a stepped shape opening 72a of the holder 72 is sealed using a sealant 73.

Figure 5:
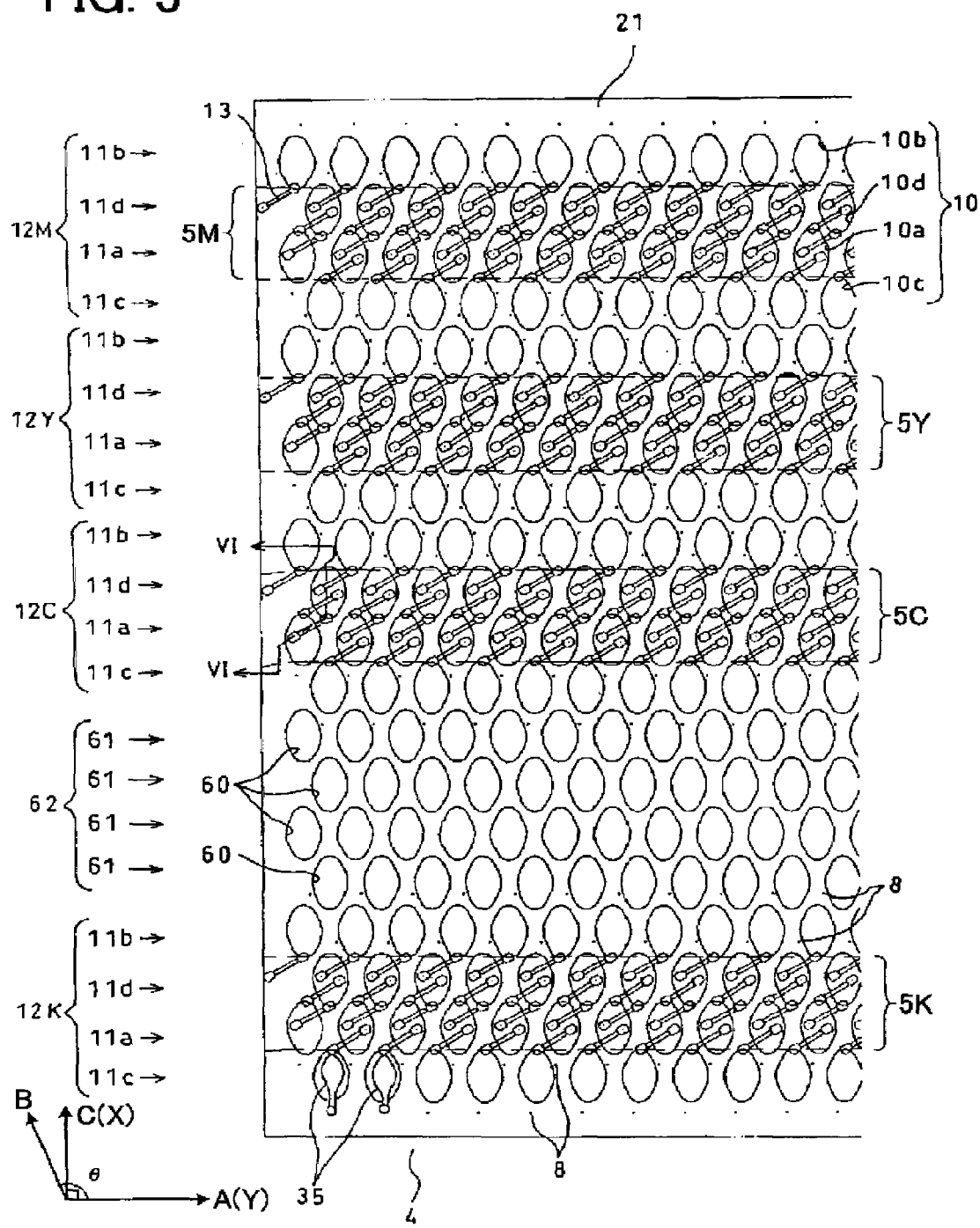
FIG. 5 shows an enlarged view of a portion enclosed by the dashed line in FIG. 4.
Figure 6:
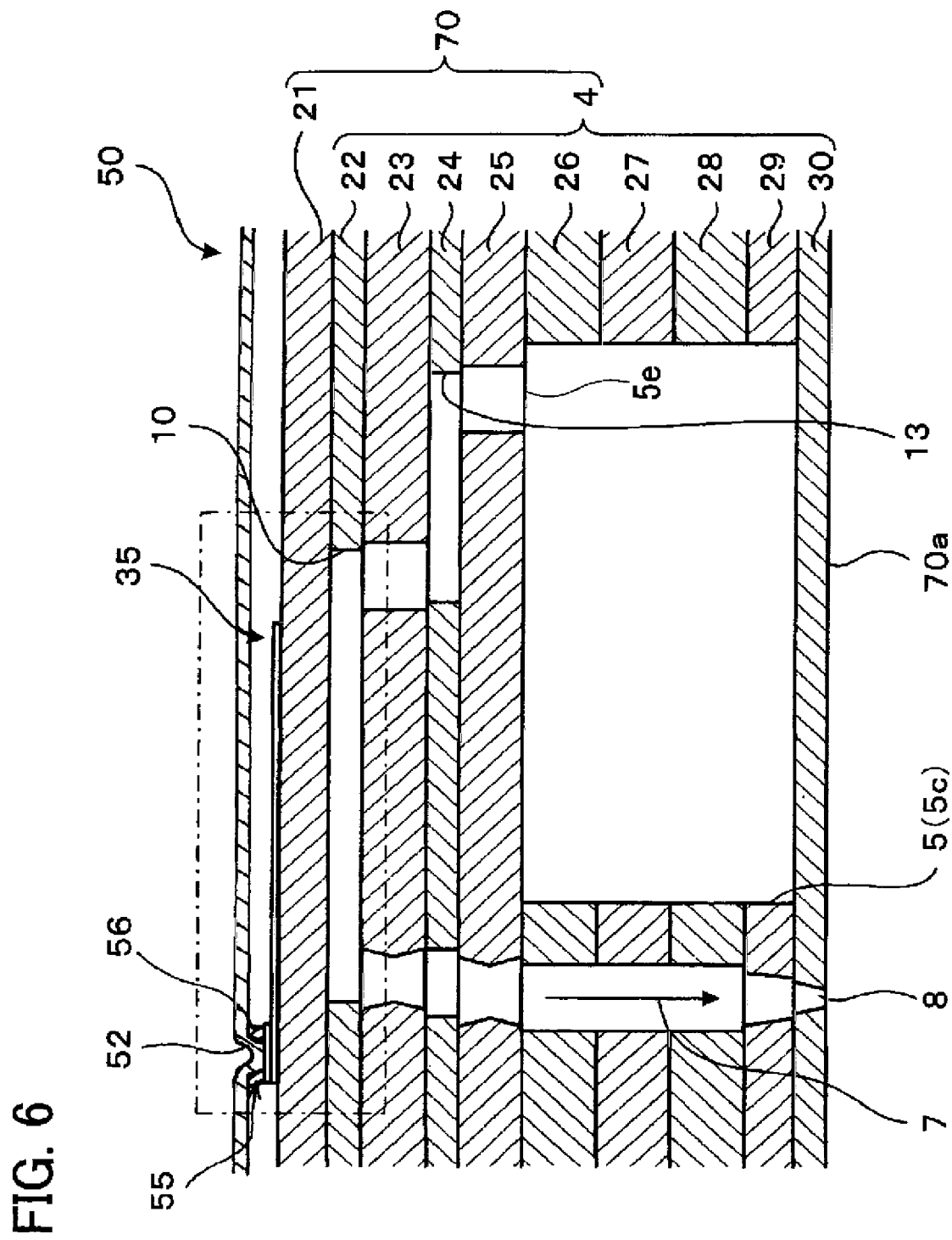
FIG. 6 shows a cross-sectional view along the line VI-VI of FIG. 5.

A plurality of nozzles 8 having an extremely small diameter are formed in a base surface of the head main body 70 (see FIGS. 5 and 6). The number 8 has been applied to only a portion of the nozzles in FIG. 5. However, all of the extremely small dots shown are nozzles. The base surface of the head main body 70 forms the ink discharge face 70a.

As shown in FIG. 2, the actuator unit 21 of the head main body 70 is fixed to the upper surface of the passage unit 4. The plan shape of the actuator unit 21 is smaller than the plan shape of the passage unit 4, and the actuator unit 21 does not cover the four ink inlet ports 4M, 4Y, 4C, and 4K. This relationship is shown in FIG. 4.

Figure 7:
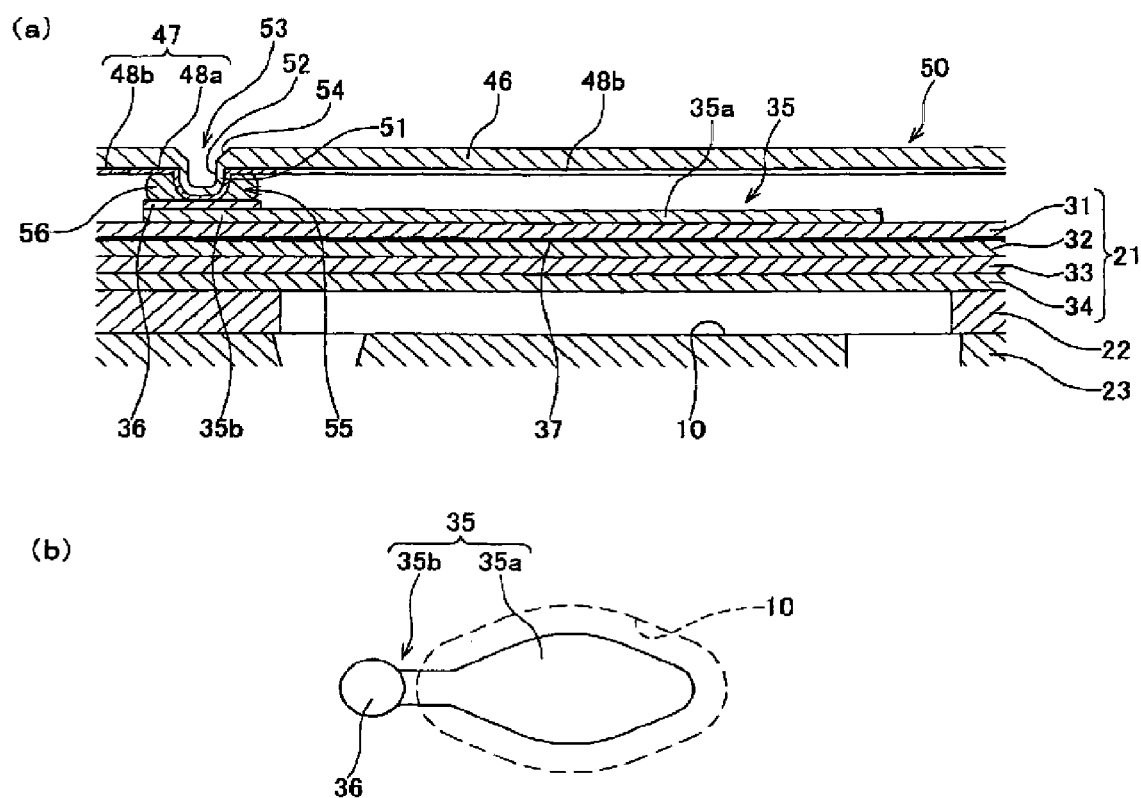
FIG. 7 shows an actuator unit.

The FPC 50 is fixed to an upper surface of the actuator unit 21 using a thermosetting adhesive 56 (see FIG. 7). The FPC 50 extends to one side in the main scanning direction, and extends upwards in a bent manner. The FPC 50 is flexible and, due to it being bent, follows the movement of the ink jet head 1 in the main scanning direction.

As shown in FIGS. 2 and 3, a protecting plate 44 is bonded to an upper surface of the FPC 50 at a portion thereof opposite the actuator unit 21. The protecting plate 44 protects the FPC 50 and the actuator unit 21.

As shown in FIG. 2, the FPC 50 fixed to the actuator unit 21 extends along a side face of the ink tank 71 via a resilient member 74 such as a sponge or the like. A driver IC 75 is mounted on the FPC 50. The FPC 50 transmits the driving power output from the driver IC 75 to the actuator unit 21 (to be described) of the head main body 70. The FPC 50 is connected with the actuator unit 21, and is a flat connector for transmitting driving power to the actuator unit 21.

As shown in FIG. 2, an opening 72b is formed in a side wall of the holder 72 opposite the driver IC 75. The opening 72b allows heat from the driver IC 75 to dissipate to the exterior. A heat sink 76 having an approximately rectangular parallelepiped shaped aluminum sheet is located between the driver IC 75 and the opening 72b of the holder 72, and is disposed such that it fits tightly with the driver IC 75. The heat sink 76 and the opening 72b allow the heat generated by the driver IC 75 to be dissipated efficiently. A sealant 77 is disposed within the opening 72b so as to fill space between the heat sink 76 and the side wall of the holder 72. Refuse or ink is thus prevented from entering the main body of the ink jet head 1.

FIG. 4 shows a plan view of the head main body 70. As shown in FIG. 4, the head main body 70 has a rectangular shape from a plan view, with its longer sides extending in the sub scanning direction shown by the arrow Y. Four manifold passages 5M, 5Y, 5C, and 5K extend within the passage unit 4 in the lengthwise direction thereof. The manifold passage 5M joins with the ink inlet port 4M, the manifold passage 5Y joins with the ink inlet port 4Y, the manifold passage 5C joins with the ink inlet port 4C, and the manifold passage 5K joins with the ink inlet port 4K.

Ink is delivered to the manifold passages 5M, 5Y, 5C, 5K within the passage unit 4 from the ink cartridges via the ink chambers 3M, 3Y, 3C, 3K, and the ink discharge ports 2M, 2Y, 2C, 2K of the ink tank 71, the through holes 41M, 41Y, 41C, 41K of the reinforcing sheet 41, and the ink inlet ports 4M, 4Y, 4C, 4K of the passage unit 4. A filter member 45 is disposed at the upper surface of the passage unit 4 at a location such that it covers the four ink inlet ports 4M, 4Y, 4C, and 4K. The filter member 45 has filters 45a that have a plurality of extremely small holes. These filters 45a are located so as to overlap with the four ink inlet ports 4M, 4Y, 4C, and 4K. The filters 45a of the filter member 45 trap refuse, etc. that were in the ink being delivered from the ink tank 71 into the passage unit 4.

The actuator unit 21, which is rectangular from a plan view, is connected with the upper surface of the passage unit 4. The actuator unit 21 is shorter than the passage unit 4, and does not cover the ink inlet ports 4M, 4Y, 4C, and 4K. The portion of a lower surface of the passage unit 4 where the actuator unit 21 is present forms an ink discharging portion having the plurality of nozzles 8 (see FIGS. 5 and 6) distributed thereon. A plurality of pressure chambers 10 (see FIGS. 5, 6) and spaces 60 (see FIG. 5) are disposed in a matrix shape in the connected portion of the passage unit 4 opposite the actuator unit 21. In other words, the actuator unit 21 has dimensions such that it covers all the pressure chambers 10 and spaces 60.

FIG. 5 shows an enlarged view of a portion enclosed by the dashed line in FIG. 4. The plurality of pressure chambers 10 are aligned in a matrix shape at the upper surface of the passage unit 4. Specifically, sixteen rows 11 of pressure chambers 10 are provided, each of these rows 11 having a plurality of pressure chambers 10 aligned in a transverse direction. The sixteen rows 11 of pressure chambers 10 extend parallel to the manifold passages 5. Four rows 11 of pressure chambers 10 form one set, and four sets are provided. A first set 12M joins with the manifold passage 5M for magenta ink and the nozzles 8 for magenta ink. A second set 12Y joins with the manifold passage 5Y for yellow ink and the nozzles 8 for yellow ink. A third set 12C joins with the manifold passage 5C for cyan ink and the nozzles 8 for cyan ink. A fourth set 12K joins with the manifold passage 5K for black ink and the nozzles 8 for black ink.

The plurality of spaces 60 are aligned in a matrix shape at the upper surface of the passage unit 4. Specifically, four rows 61 of spaces 60 are provided, each of these rows 61 having a plurality of spaces 60 aligned in a transverse direction. The spaces 60 are not connected with the manifold passages 5 or the nozzles 8.

The sixteen rows 11 of pressure chambers 10 are separated by the four rows 61 of spaces 60 into a group of twelve (the first to third sets, for magenta, yellow, and cyan), and a group of four (the fourth set, for black). The four rows 61 of spaces 60 separate the nozzles 8 for magenta, yellow, and cyan from the nozzles 8 for black. It is thus possible to form two caps separately: a cap for protecting the magenta, yellow, and cyan nozzles 8 from the air, and a cap for protecting the black nozzles 8 from the air. It is thus possible to cap only the black nozzles 8, or only the magenta, yellow, and cyan nozzles 8.

As shown in FIG. 5, the pressure chambers 10 and the spaces 60 are identical in size and, from a plan view, in shape. The pressure chambers 10 and the spaces 60 are not indistinguishable, however, but are disposed systematically so as to form one distributive pattern on the passage unit 4.

The pressure chambers 10 formed in the passage unit 4 are, from a plan view, approximately rhomboid shaped, with the angles thereof being chamfered. A longer line between the angles thereof is parallel with a widthwise direction of the passage unit 4 (the main scanning direction shown by the arrow X). One end of each pressure chamber 10 joins with one of each of the nozzles 8, and the other end joins with the manifold passage 5 via an aperture 13. In order to render the figure easier to understand, the pressure chambers 10, the spaces 60, the apertures 13, the nozzles 8, etc. have been drawn with a solid line in FIG. 5 even though they should have been drawn with a broken line as they are inside the passage unit 4.

Figure 18:
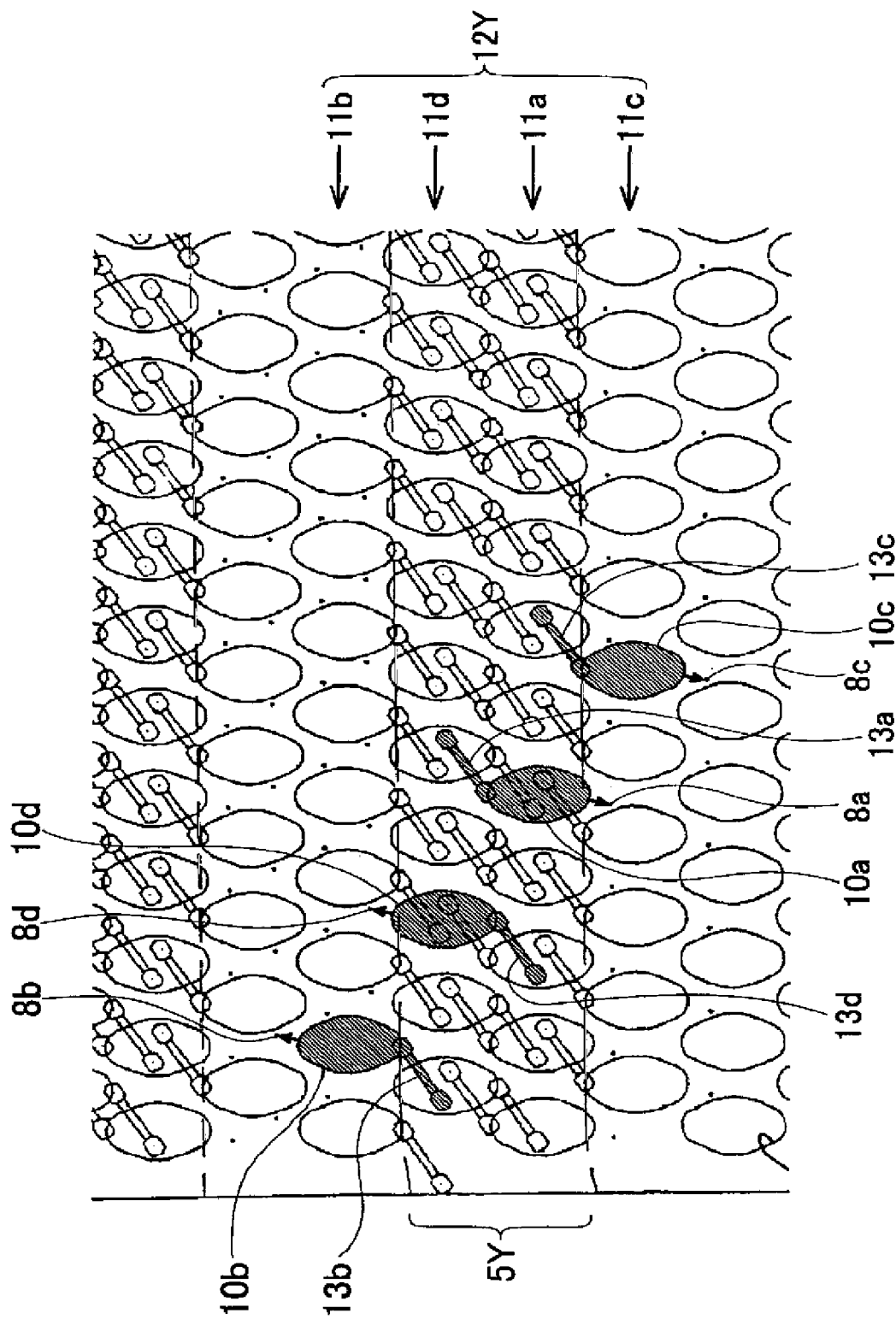
FIG. 18 shows a combination of an aperture, a pressure chamber and a nozzle.

FIG. 18 shows the relationship between the four rows 11b, 11d, 11a, and 11c of pressure chambers 10 of the second set 12Y, the manifold passage 5Y for yellow ink, the nozzles 8b, 8d, 8a, and 8c for yellow ink, and the apertures 13b, 13d, 13a, and 13c for yellow ink. A pressure chamber 10b of the row 11b is connected with the manifold passage 5Y via an aperture 13b. A pressure chamber 10d of the row 11d is connected with the manifold passage 5Y via an aperture 13d. A pressure chamber 10a of the row 11a is connected with the manifold passage 5Y via the aperture 13a. A pressure chamber 10c of the row 11c is connected with the manifold passage 5Y via an aperture 13c.

The pressure chamber 10b of the row 11b is connected with a nozzle 8b. The pressure chamber 10d of the row 11d is connected with a nozzle 8d. The pressure chamber 10a of the row 11a is connected with a nozzle 8a. The pressure chamber 10c of the row 11c is connected with a nozzle 8c.

FIG. 6 shows a cross-sectional view showing an ink passage formed within the passage unit 4, and shows a cross-sectional view along the line VI-VI of FIG. 5. As is clear from FIG. 6, one ink passage extends from an outlet 5e of the manifold passage 5 to the nozzle 8 via the aperture 13 and the pressure chamber 10. One ink passage is formed for each single pressure chamber 10 and each single nozzle 8 within the head main body 70.

As shown in FIG. 6, the head main body 70 includes the actuator unit 21 and the passage unit 4.

As shown in FIG. 7, the actuator unit 21 (to be described) is a layered structure comprising four piezo-electric sheets 31~34. The uppermost sheet 31 is a layer having portions that are activated when an electric field is applied (hereafter referred to as 'layer having activated portions'). The remaining three layers 32, 33, and 34 are non-activated layers without activated portions.

As shown in FIG. 6, the passage unit 4 is a layered structure having a total of nine stacked sheets. Sequentially from the top, these are: a cavity plate 22, a base plate 23, an aperture plate 24, a supply plate 25, manifold plates 26~29, and a nozzle plate 30.

The cavity plate 22 is a metal plate wherein the plurality of rhomboid shaped holes that form the pressure chambers 10 and the spaces 60 are formed within the bonded area (the connecting area) of the actuator unit 21. The base plate 23 is a metal plate provided with, for each of the pressure chambers 10 of the cavity plate 22, a connecting hole for connecting the pressure chamber 10 and the aperture 13, and a connecting hole for connecting the pressure chamber 10 and the nozzle 8.

The aperture plate 24 is a metal plate provided with, for each of the pressure chambers 10 of the cavity plate 22, a long hole that forms the aperture 13, and a connecting hole for connecting the pressure chamber 10 and the nozzle 8. The supply plate 25 is a metal plate provided with, for each of the pressure chambers 10 of the cavity plate 22, a connecting hole for connecting the aperture 13 and the manifold passage 5, and a connecting hole for connecting the pressure chamber 10 and the nozzle 8. The manifold plates 26~29 are metal plates provided with holes that form the manifold passages 5 and, for each of the pressure chambers 10, a connecting hole for connecting the pressure chamber 10 and the nozzle 8. The nozzle plate 30 is a metal plate provided with the nozzles 8 for each of the pressure chambers 10 of the cavity plate 22.

As shown in FIG. 6, the ten sheets 21~30 are stacked with a positional relationship such that they form an ink passage 7 when the sheets have been stacked. The ink passage 7 first extends upwards along the manifold passage 5, extends horizontally along the aperture 13, then extends further upwards, extends horizontally at the pressure chamber 10, continues downwards in an inclined manner away from the aperture 13, and finally faces vertically downwards to the nozzle 8.

As is clear from FIG. 6, the pressure chamber 10 and the aperture 13 are formed at differing heights relative to the direction in which the plates are stacked. As a result, as shown in FIGS. 5 and 18, the aperture 13 that joins with one pressure chamber 10 can be disposed such that, from a plan view, the aperture 13 overlaps with a separate adjoining pressure chamber 10. As a result, both the pressure chambers 10 and the nozzles 8 can be disposed with a high density. An ink jet head 1 which has a comparatively small occupied area thus prints high resolution images.

As shown in FIG. 5, each pressure chamber 10 joins with the nozzle 8 at one end of a longer line between the angles of the pressure chamber 10, and the other end joins with the manifold passage 5 via the aperture 13. As will be described later, individual electrodes 35 (see FIG. 7) are distributed in a matrix shape on the actuator unit 21. The individual electrodes 35 are approximately rhomboid shaped from a plan view, are smaller than the pressure chambers 10, and are located so as to be opposite the pressure chambers 10. In order to simplify the figure, only a few of the plurality of individual electrodes 35 have been drawn in FIG. 5.

The plurality of spaces 60 formed in the cavity plate 22 are holes that have the same size and shape as the pressure chambers 10 formed in the cavity plate 22. The spaces 60 are covered by the actuator unit 21 and the base plate 23. The ink passages are not connected with the spaces 60, and the spaces 60 are not filled with ink. As shown in FIG. 5, the spaces 60 are distributed in two directions: a distribution direction A (a first direction), and a distribution direction B (a second direction). The spaces 60 form four mutually parallel rows 61 of spaces, and four rows 61 of spaces form one group 62 of spaces. The pressure chambers 10 are distributed in the passage unit 4 such that the group 62 of spaces are located therebetween.

In the present form of the embodiment, the pressure chambers 10 and the spaces 60 are formed so as to be indistinguishable in shape, size, and distribution. The pressure chambers 10 and the spaces 60 are distributed in two directions: the distribution direction A and the distribution direction B. The distribution direction A extends in the lengthwise direction of the ink jet head 1, i.e. in the lengthwise direction of the passage unit 4, and is parallel to a shorter line between the angles of the pressure chambers 10. The distribution direction B forms an obtuse angle θ with respect to the distribution direction A, and extends in the direction of the oblique sides of the pressure chambers 10.

The pressure chambers 10, which are distributed in the distribution direction A and the distribution direction B, are distributed along the distribution direction A with spaces therebetween that correspond to resolution. For example, in the present form of the embodiment, the nozzles 8 are capable of a resolution of 150 dpi (dots per inch). Consequently, adjoining pressure chambers 10 are each separated in the distribution direction A by a distance corresponding to 37.5 dpi. Four rows 11 of pressure chambers are formed for one color of ink, and consequently four rows of nozzles correspond to one color of ink. When all four rows of nozzles are taken into consideration, the nozzles 8 are distributed in the distribution direction A at a density equivalent to 150 dpi.

In the distribution direction B, the pressure chambers 10 are aligned within the actuator unit 21 such that maximally sixteen pressure chambers 10 are aligned with four spaces 60 being located therebetween. Viewed from a vertical direction with respect to the face of page 5 (a third direction), eight pressure chambers 10 are aligned in a direction (a fourth direction, that is, the main scanning direction X) orthogonal to the distribution direction A, and two spaces 60 are located therebetween.

The pressure chambers 10 that have been distributed in a matrix shape form the rows 11 of pressure chambers that extend in the distribution direction A shown in FIG. 5. When viewed from the vertical direction with respect to the face of page 5, the rows 11 of pressure chambers are divided into the first row 11a of pressure chambers, the second row 11b of pressure chambers, the third row 11c of pressure chambers, and the fourth row 11d of pressure chambers at positions corresponding to the manifold passages 5. These first to fourth rows 11a~11d of pressure chambers are distributed periodically in groups of four as follows (in sequence from the bottom to the top of FIG. 5): 11c→11a→11d→11b→11c→11a→ . . . 11b. The first to fourth rows of pressure chambers distributed periodically in groups of four form the four sets 12 of pressure chambers.

The pressure chambers 10 of each set 12 of pressure chambers are joined with the respective manifold passages 5 via the respective apertures 13. That is, a set 12 of pressure chambers is formed for each manifold passage 5, and consequently the sets 12 of pressure chambers are divided into sets 12M, 12Y, 12C, and 12K that correspond to the four colors of ink. The actuator unit 21 causes a change in capacity of the pressure chambers 10 of these four sets 12M, 12Y, 12C, and 12K. This change in capacity allows the four colors of ink to be discharged from the nozzles 8 that join with the sets 12 of pressure chambers.

As shown in FIG. 18, the nozzle 8b of the pressure chamber 10b of the row 11b of pressure chambers is formed upwards and to the right of the pressure chamber 10b. The nozzle 8d of the pressure chamber 10d of the row 11d is formed upwards and to the right of the pressure chamber 10d. The nozzle 8a of the pressure chamber 10a of the row 11a is formed downwards and to the left of the pressure chamber 10a. The nozzle 8c of the pressure chamber 10c of the row 11c is formed downwards and to the left of the pressure chamber 10c.

In the rows 11a and 11d of pressure chambers, the manifold passages 5 overlap with more than half of the pressure chambers 10a and 10d. In the rows 11b and 11c of pressure chambers, there is approximately no overlap whatsoever between the manifold passages 5 and the pressure chambers 10b and 10c. There is no overlap between the nozzles 8 and the manifold passages 5 in the case of any of the pressure chambers 10. The manifold passages 5 are as wide as can be managed without their interfering with the nozzles 8. Therefore the ink can be delivered smoothly to the pressure chambers 10.

Next, the structure of the actuator unit 21 and the FPC 50 will be described. The plurality of individual electrodes 35 are distributed in a matrix shape on the upper surface of the actuator unit 21 and have the same distributive pattern as the pressure chambers 10. The individual electrodes 35 are disposed so as to be opposite the pressure chambers 10 from a plan view. This regular distribution of the pressure chambers 10 and the individual electrodes 35 makes design easier.

Figure 8:
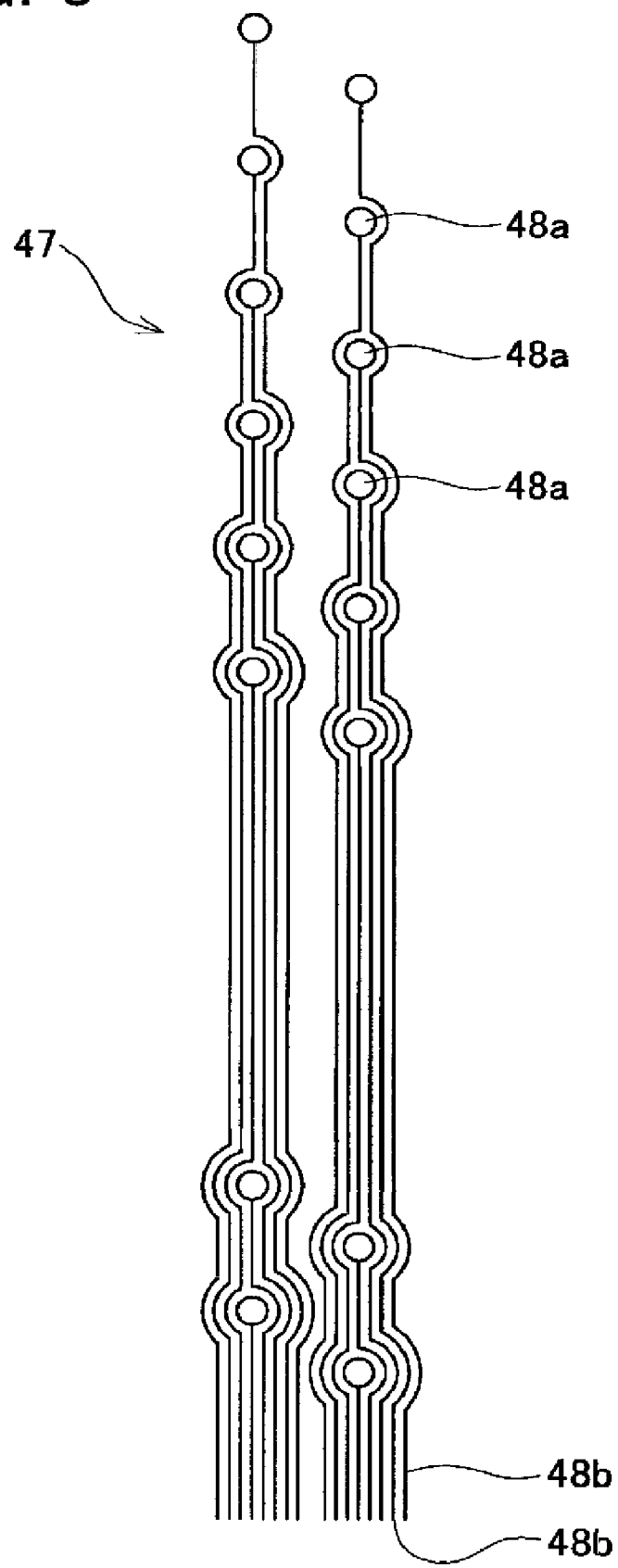
FIG. 8 shows an enlarged plan view of an FPC shown in FIG. 2.

FIG. 7 shows the actuator unit. FIG. 7(a) is an enlarged view of a portion enclosed by the dashed line in FIG. 6. FIG. 7(b) is a plan view of the individual electrode. FIG. 8 is an enlarged plan view of the FPC 50 shown in FIG. 2. In order to render the figure easier to understand, the conductive spots 48a and conductive lines 48b, etc. have been drawn with a solid line in FIG. 8 even though they should have been drawn with a broken line as they are inside the FPC 50. As shown in FIGS. 7(a) and (b), the individual electrodes 35 are located opposite the pressure chambers 10. The individual electrodes 35 each comprise a main electrode portion 35a and a contact portion 35b. From a plan view, the main electrode portion 35a is formed inside the range of the pressure chamber 10. The contact portion 35b is formed outside the range of the pressure chamber 10 and is connected with the main electrode portion 35a.

As shown in FIG. 7(a), the actuator unit 21 contains the four piezo-electric sheets 31~34 each having a thickness of approximately 15 μm. The piezo-electric sheets 31~34 are continuous layer shaped plates (continuous plate layers) that are disposed to as to extend across the plurality of pressure chambers 10 and spaces 60 formed in the ink discharging portion of the head main body 70. Since the piezo-electric sheets 31~34 are continuous plate layers that are disposed so as to extend across the plurality of pressure chambers 10, the individual electrodes 35 can be disposed with a high density on the piezo-electric sheet 31 by means of, for example, a screen printing technique. The pressure chambers 10 can therefore also be distributed with a high density in locations corresponding to the locations of the individual electrodes 35. The piezo-electric sheets 31~34 are formed of ferroelectric lead zirconate titanate (PZT) ceramic material.

As shown in FIG. 7(b), the main electrode portions 35a of the individual electrodes 35 formed on the uppermost piezo-electric sheet 31 have a shape that, from a plan view, is approximately a rhomboid and resembles the pressure chambers 10. An acute angled part of the approximately rhomboid shaped main electrode portion 35a, at the left side in FIG. 7(b), protrudes so as to overlap with an acute angled part of the pressure chamber 10, and is connected with the contact portion 35b. A circular land 36 is formed at a distal end of the contact portion 35b. The land 36 is electrically connected with the individual electrode 35. The land 36 forms a contact that is electrically connected with the conductive spot 48a (to be described). As shown in FIG. 7(b), the lands 36 are located at portions of the cavity plate 22 that do not have the pressure chambers 10 formed therein. The diameter of the land 36 is approximately 0.3 mm, and the thickness thereof is approximately 10 μm. The land 36 is composed of, for example, metal that contains glass flit. As shown in FIG. 7(a), the lands 36 are formed on a top face of the contact portions 35b.

A common electrode 37 is located between the uppermost piezo-electric sheet 31 and the piezo-electric sheet 32 located therebelow. The common electrode 37 has the same outer shape as the piezo-electric sheet 31 and has a thickness of approximately 2 μm. The individual electrodes 35 and the common electrode 37 are both formed of a metal material such as, for example, Ag—Pd.

The common electrode 37 is earthed at a region that has not been shown. The portions corresponding to all the pressure chambers 10 are thus maintained at an identical constant voltage by the common electrode 37. In the present form of the embodiment, earth voltage is maintained.

The FPC 50 shown in FIG. 7(a) has a base film (a flexible layer) 46, and a conductive pattern 47 formed on a lower face (a face opposite the head main body 70) of the base film 46. In the present form of the embodiment, the base film 46 consists of a bendable insulating polyimide resin film. However, as long as it is insulating, the base film 46 may be a resin film consisting of, for example, polyethylene, polycarbonate, polystyrene, polypropylene, etc. Further, the conductive pattern 47 is formed from copper foil.

As shown in FIG. 8, the conductive pattern 47 has the plurality of conductive spots 48a and conductive lines 48b. The conductive spots 48a are formed so as to be opposite the lands 36 of individual electrodes 35 formed on the top surface of the piezo-electric sheet 31. The conductive lines 48b extend from a central part of a lower end of each conductive spot 48a and extend downwards towards a lower side of FIG. 8 (towards a base side of the FPC 50). From a plan view, the conductive spots 48a are circular. Gold plating (not shown) is performed on a surface of the conductive spots 48a in order to prevent oxidization of the conductive spots 48a and to maintain reliable conductivity between the conductive spots 48a and the lands 36.

The conductive lines 48b have a width approximately 1/10 the diameter of the conductive spots 48a. The conductive lines 48b are disposed such that one of the conductive lines 48b extends from each one of the conductive spots 48a and provides electrical connection. The conductive lines 48b are mutually separate, and are disposed such that they skirt around the conductive spots 48a. Each of the conductive lines 48b is connected with the driver IC 75 at the base side of the FPC 50. The conductive lines 48b that extend from the conductive spots 48a are thus formed on the base film 46, and consequently the FPC 50 can be positioned as desired. There is thus a degree of freedom in the positional relationship between the FPC 50 and the driver IC 75 with which it is electrically connected.

As shown in FIG. 5, eight of the pressure chambers 10 are aligned in the fourth direction (X direction). As a result, eight of the lands 36 are also aligned in the fourth direction. Corresponding therewith, eight of the conductive spots 48a are also aligned in the fourth direction.

The conductive lines 48b are exposed, but do not make contact with the lands 36. The height of the projections of the conductive spots 48a prevents the conductive lines 48b and the lands 36 from making contact. If necessary, an insulating cover film may be applied to a lower face of the FPC 50. The conductive spots 48a pass through this cover film, and the conductive lines 48b are covered by the cover film.

As shown in FIG. 7, half etching is performed at portions of the base film 46 opposite the lands 36, thus reducing the thickness of these portions of the base film 46 to form thinner portions 53. In the present form of the embodiment, the thinner portions 53 are approximately circular from a plan view. However, the thinner portions 53 may be triangular, square, oval, etc. from a plan view. Peripheral edges of the thinner portions 53 form tapered faces 54 that are open in an upwards direction relative to the page.

As shown in FIG. 7(a), a projection 51 is formed at approximately the center of each thinner portion 53. The projections 51 protrude from a lower face of the base film 46 towards a center of each land 36. The projections 51 are formed by means of a pressing operation in which punches 91 (to be described) press the base film 46 from its upper face to its lower face. Forming the projections 51 of the base film 46 causes recesses 52 to be formed at locations opposite the projections 51. These projections 51 and recesses 52 cause protruding parts 55 to be formed in the conductive spots 48a, as shown in FIG. 7(a). These protruding parts 55 protrude towards the center of the lands 36. From a plan view, the entireties of the projections 51 are located within the thinner portions 53, and the protruding parts 55 are also located within the thinner portions 53. As a result, any part of the projections 51 is thinner than the base film 46 surrounding the thinner portions 53. The projections 51 are covered by the conductive spots 48a, and the conductive spots 48a are formed in a projecting shape.

As shown in FIG. 7(a), a non-conductive epoxy thermosetting adhesive 56 is disposed so as to surround the protruding parts 55. The contractive force associated with the hardening of the adhesive 56 causes distal ends of the protruding parts 55 to make contact with and be pressed against the top surface of each of the lands 36. The conductive spots 48a and the lands 36 thus adopt an electrically connecting state. With this structure, the FPC 50 can transmit driving force from the driver IC 75 to each of the individual electrodes 35 via each of the conductive spots 48a and each of the conductive lines 48b. That is, each of the plurality of individual electrodes 35 is connected with the driver IC 75 via each of the conductive spots 48a and each of the conductive lines 48b that are located mutually independently on the FPC 50. Each of the pressure chambers 10 can thus be commanded to discharge ink.

Next, the method for driving the actuator unit 21 will be described. The actuator unit 21 has a 'unimorph' type structure having stacked layers comprising one piezo-electric sheet 31 and three piezo-electric sheets 32~34. Thickness of the piezo-electric sheet 31 can be altered by changing the voltage between the common electrode 37 and the individual electrodes 35. Thickness does not change of the three piezo-electric sheets 32~34.

The piezo-electric sheet 31 that is between the individual electrodes 35 and the common electrode 37 expands or contracts in-plane due to piezo-electric effects when an electric field is applied. In general, the direction of polarization of the piezo-electric sheet is along its thickness direction and when the direction of the electric field applied to the piezo-electric sheet and the direction of polarization of the piezo-electric sheet are the same, the piezo-electric sheet 31 contracts in-plane and increases its thickness. When the direction of the electric field applied to the piezo-electric sheet and the direction of polarization of the piezo-electric sheet are opposite, the piezo-electric sheet 31 expands in-plane and decreases its thickness. For example, when positive voltage is applied to the individual electrodes 35, the piezo-electric sheet 31 expands in-plane, and decreases its thickness. When negative voltage is applied to the individual electrodes 35, the piezo-electric sheet 31 contracts in-plane, and increases its thickness.

By contrast, an external electric field is not applied to the three piezo-electric sheets 32~34 located below the piezo-electric sheet 31, and therefore they do not expand or contract in-plane.

When, for example, positive voltage has been applied to the individual electrodes 35, and the piezo-electric sheet 31 therefore expands in-plane, the piezo-electric sheets 31~34 that comprise the stacked structure deform so as to protrude upwards (unimorph deformation) at the portions corresponding to the individual electrodes 35. There is an increase in the capacity of the pressure chambers 10 corresponding to the individual electrodes 35 to which positive voltage was applied, pressure of the pressure chambers 10 therefore decreases, and ink is drawn from the manifold passages 5 to the pressure chambers 10 via the apertures 13.

Conversely, when negative voltage has been applied to the individual electrodes 35, and the piezo-electric sheet 31 therefore contracts in-plane, the piezo-electric sheets 31~34 that comprise the stacked structure deform so as to protrude downwards (unimorph deformation) at the portions corresponding to the individual electrodes 35. There is a decrease in the capacity of the pressure chambers 10 corresponding to the individual electrodes 35 to which negative voltage was applied, the pressure of the pressure chambers 10 therefore increases, and ink is discharged from the corresponding nozzles 8.

There are various ways in which the voltage applied to the individual electrodes can be varied. For example, a method is possible where the individual electrodes 35 normally have a voltage that differs from the voltage of the common electrode 37. When ink discharge is required, the individual electrodes 35 are caused to temporarily have the same voltage as the common electrode 37, and then are returned to differing voltages. The piezo-electric sheets 31~34 that comprise the stacked structure become flat while the individual electrodes 35 and the common electrode 37 have the same voltage, thus realizing a state in which the pressure chambers 10 have a large capacity. When the voltage of the individual electrodes 35 is caused to differ from the voltage of the common electrode 37, the piezo-electric sheets 31~34 that comprise the stacked structure bend so as to protrude downwards, and a state is realized in which the pressure chambers 10 have a small capacity. With the aforementioned conductive pattern, the capacity of the pressure chambers 10 is normally small. The capacity of the pressure chambers 10 is increased when ink discharge is required, and ink is thus drawn into the pressure chambers 10. The capacity of the pressure chambers 10 is then reduced, and the ink is thus discharged from the nozzles 8.

In the case where the piezo-electric sheets 31~34 that comprise the stacked structure bend so as to protrude upwards when voltage is applied to the individual electrodes (this being a voltage different from the earth voltage), and the capacity of the pressure chambers 10 is thereby increased, a method is also possible where the individual electrodes 35 normally have a voltage identical with the voltage of the common electrode 37. When ink discharge is required, a voltage is applied to the individual electrodes 35 so that the individual electrodes 35 and the common electrode 37 temporarily have differing voltages. Then, the individual electrodes 35 and the common electrode 37 return to having identical voltage. The piezo-electric sheets 31~34 that comprise the stacked structure are flat while the individual electrodes 35 and the common electrode 37 have the same voltage, thus realizing a state in which the pressure chambers 10 have a small capacity. When the voltage of the individual electrodes 35 differs from the voltage of the common electrode 37, the piezo-electric sheets 31~34 that comprise the stacked structure bend so as to protrude upwards, thus realizing a state in which the pressure chambers 10 have a large capacity. With the aforementioned conductive pattern, the capacity of the pressure chambers 10 is normally small. The capacity of the pressure chambers 10 is increased when ink discharge is required, and ink is thus drawn into the pressure chambers 10. The capacity of the pressure chambers 10 is then reduced, and the ink is thus discharged from the nozzles 8.

In the case where the piezo-electric sheets 31~34 become flat, while voltages of the individual electrode and the common electrode are identical, and protrude downwardly, while a voltage differing from the voltage of the common electrode is applied to the individual electrode, a driving method is also possible where the individual electrode normally has the voltage identical with the voltage of the common electrode 37 and the voltage differing from the voltage of the common electrode is applied to the individual electrode when ink discharge is required. When the voltage differing from the voltage of the common electrode is applied to the individual electrode, capacity of the pressure chamber is reduced and ink is discharged from the nozzle. When the voltage of the individual electrode returns to the voltage of the common electrode, capacity of the pressure chamber is returned to the normal value, and ink is sucked into the pressure chamber.

In the case of a driving method where the voltage of the individual electrodes 35 is normally the same as the voltage of the common electrode 37, a driving method is also possible where the voltage of the individual electrodes 35 is caused to differ from the voltage of the common electrode 37. The voltage applied to the individual electrodes 35 may be switched as required between positive voltage, earth voltage, and negative voltage.

The ink jet head 1 is moved in the main scanning direction and the paper is moved in the sub scanning direction while ink is being discharged from the nozzles 8, and the desired image is thereby printed on the paper.

Figure 9:
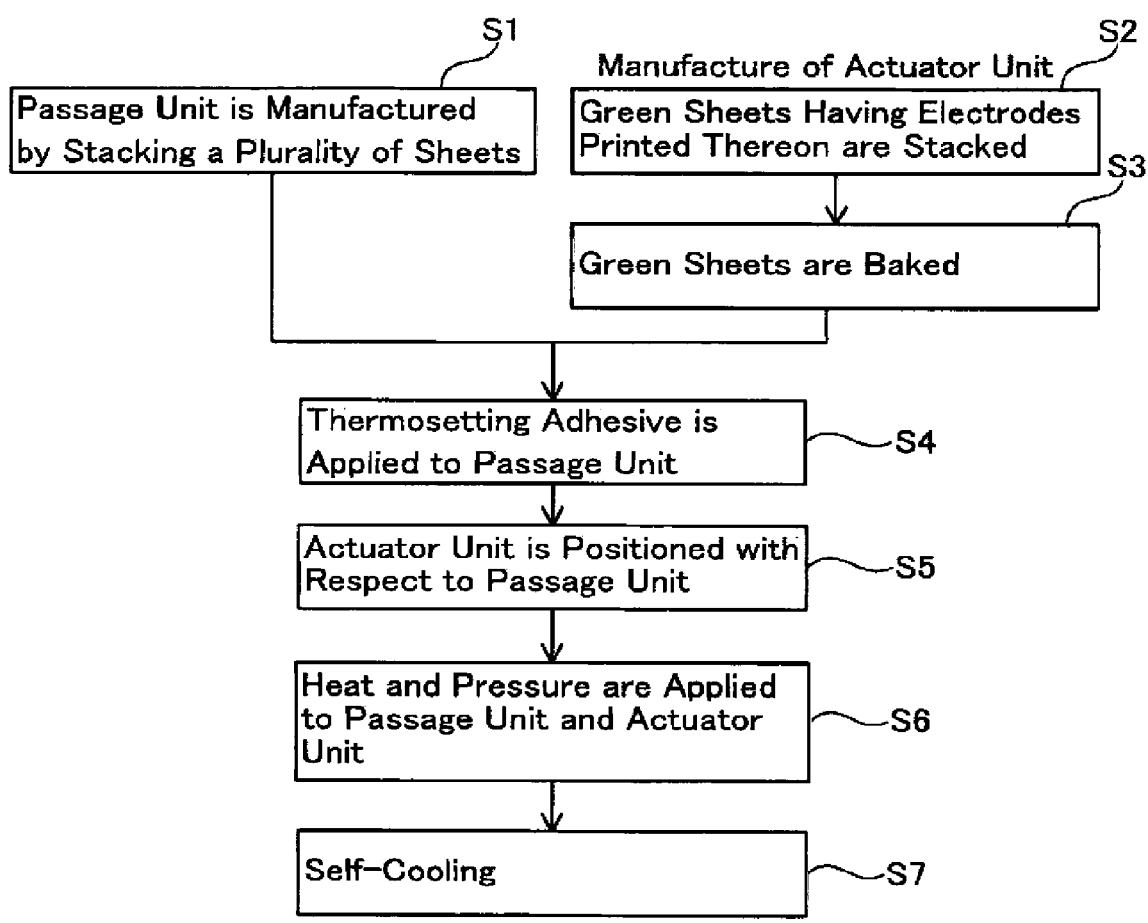
FIG. 9 shows a manufacturing process of the ink jet head.
Figure 10:
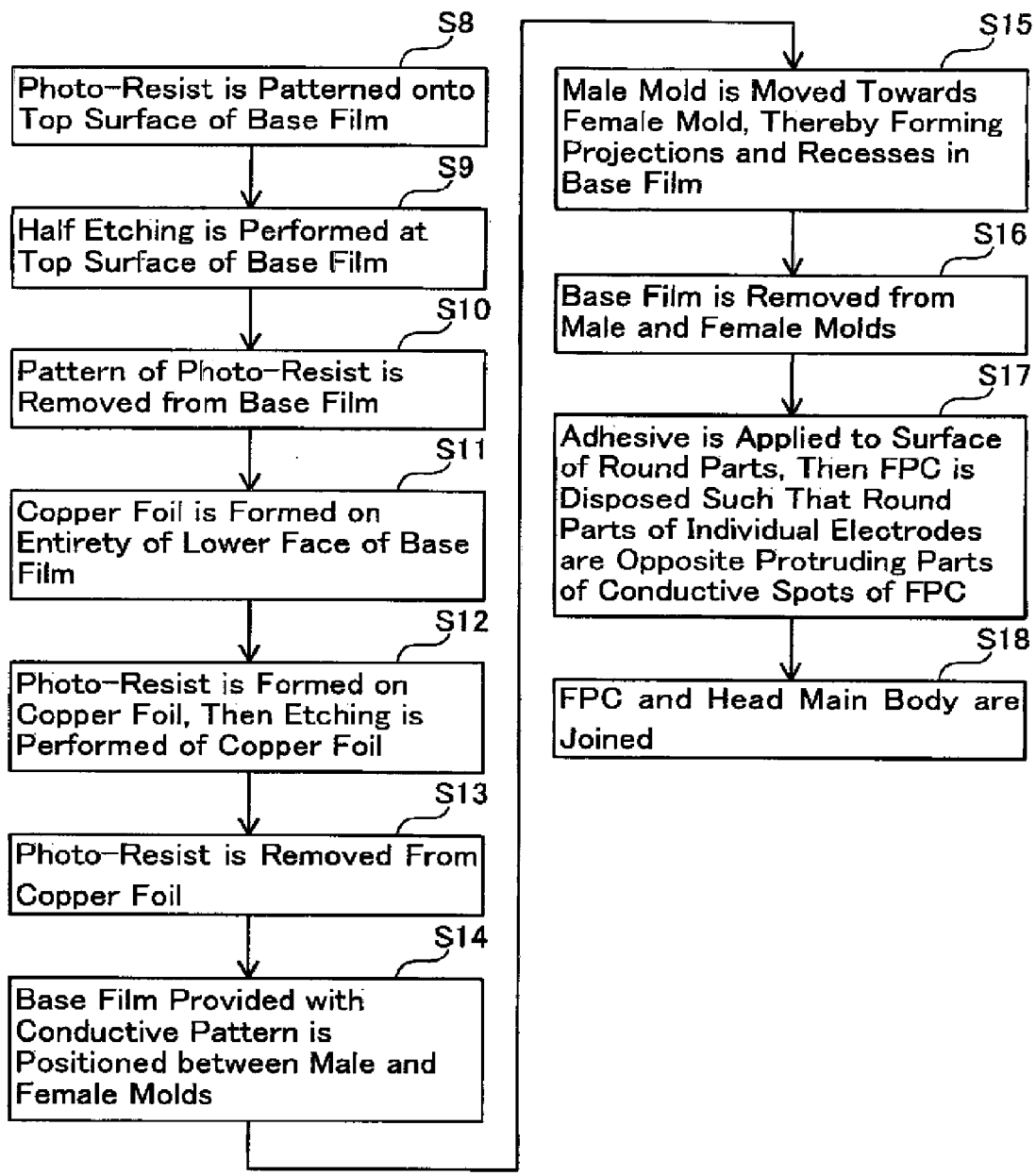
FIG. 10 shows the manufacturing process of the ink jet head.

Next, the method of manufacturing the above ink jet head 1 will be described with reference to figures. FIGS. 9 and 10 show a manufacturing process of the ink jet head 1. The ink jet head 1 is manufactured by means of a step for manufacturing the head main body 70, a step for manufacturing the FPC 50, and a step for joining the FPC 50 to the actuator unit 21 of the head main body 70. The step for manufacturing the head main body 70 will be described first.

In manufacturing the head main body 70, the components such as the passage unit 4 and the actuator unit 21 are manufactured separately, and then these components are assembled. First, in step 1 (S1), the passage unit 4 is manufactured. To manufacture the passage unit 4, a photo-resist on which patterning has been performed is formed on surfaces of the plates 22~30, and etching is then performed of the plates 22~30 that comprise the passage unit 4, thus forming the holes in the plates 22~30 as shown in FIG. 6. Then, the nine plates 22~30 are positioned and stacked so as to form the individual ink passages 7, and are fixed by means of an epoxy thermosetting adhesive. The nine plates 22~30 are then pressed while heat is being applied thereto at a temperature above the setting temperature of the thermosetting adhesive. The thermosetting adhesive thus hardens, the nine plates 22~30 are fixed to one another, and the passage unit 4, as shown in FIG. 6, is obtained.

In manufacturing the actuator unit 21, a plurality of piezo-electric ceramic green sheets are provided in step 2 (S2). Each of the green sheets is formed taking into account the degree of shrinkage while being baked. Four green sheets are used as one set. Conductive paste is screen printed onto one quarter of the green sheets that have been provided. Printing is not performed on the remaining three quarters of the green sheets.

Next, one green sheet having the printed conductive paste and three green sheets without the printed conductive paste are all positioned so as to overlap. The uppermost green sheet is stacked onto the second top sheet so that the second top sheet has the printed conductive paste at a top face of the second top sheet. The conductive paste at the top face of the second top sheet forms the common electrode 37.

In step 3 (S3), the stacked body obtained in step 2 is degreased in a manner that is known in the field of manufacturing ceramic, and is baked at a predetermined temperature. The four green sheets thus form the piezo-electric sheets 31~34, and the conductive paste forms the common electrode 37. Conductive paste is then screen printed onto the piezo-electric sheet 31 (the uppermost sheet) in a pattern that corresponds with the pattern of the individual electrodes 35. The conductive paste is baked by applying a heat process to the stacked body, thus forming the individual electrodes 35 on the piezo-electric sheet 31. Next, the lands 36 (these forming contacts) are formed by means of printing metal that contains glass flit onto the distal ends of the contact portions 35b of the individual electrodes 35. The actuator unit 21, as shown in FIG. 7, is thus manufactured.

The step of manufacturing the passage unit 4 of step 1, and the step of manufacturing the actuator unit 21 of steps 2 and 3, are each performed independently. Consequently, either step may be performed first, or the steps may be performed in parallel.

Next, in step 4 (S4), an epoxy thermosetting adhesive having a setting temperature of 80° C. is applied by means of a bar coater to a face of the passage unit 4 obtained in step 1, this face having a plurality of recesses corresponding to the pressure chambers 10. The thermosetting adhesive may be, for example, a type where two liquids are mixed.

Next, in step 5 (S5), the actuator unit 21 is mounted on the thermosetting adhesive that has been applied to the passage unit 4. At this juncture, the actuator unit 21 and the passage unit 4 are positioned such that the individual electrodes 35 and the pressure chambers 10 are mutually opposite. This positioning is performed based on positioning markers (not shown) formed on the actuator unit 21 and the passage unit 4 during the earlier manufacturing steps (step 1~step 3).

Next, in step 6 (S6), the actuator unit 21 and the passage unit 4 are pressed via thermosetting adhesive onto the stacked body by means of a device for applying heat and pressure (not shown), this device applying pressure as well as heat that exceeds the thermosetting temperature of the thermosetting adhesive. Then, in step 7 (S7), the stacked body is removed from the device for applying heat and pressure, and then self-cools. The head main body 70 that comprises the passage unit 4 and the actuator unit 21 is thus manufactured.

Next, steps for manufacturing the FPC 50 will be described. The steps for manufacturing the FPC 50 comprise:

(A) a step of forming the thinner portions 53 in the base film 46, (B) a step of forming the conductive pattern 47, and (C) a step of forming the projections 51 on the base film 46.

Figure 11:
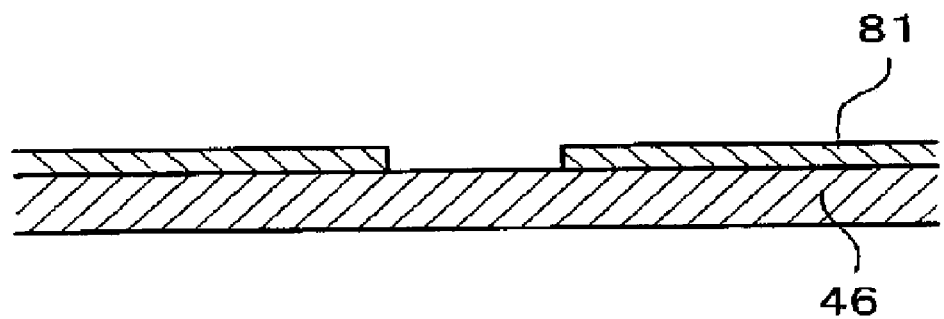
FIG. 11 shows a process for forming thinner portions during the process of manufacturing the FPC.
Figure 11:
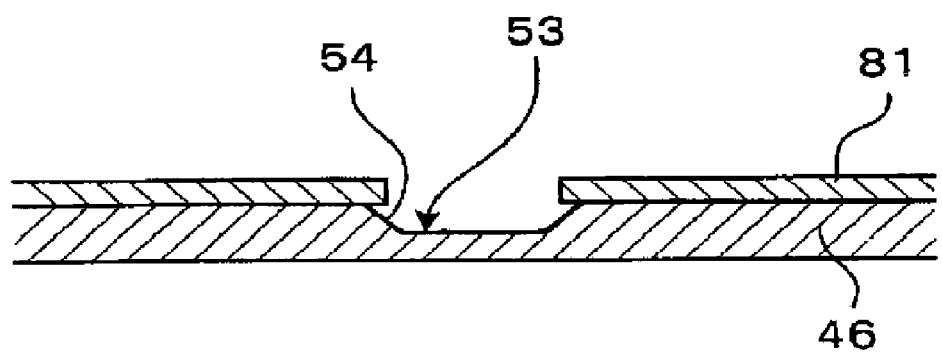
Figure 11:
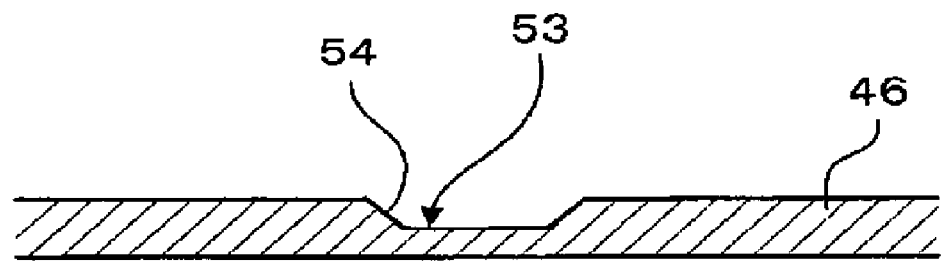
Figure 12:
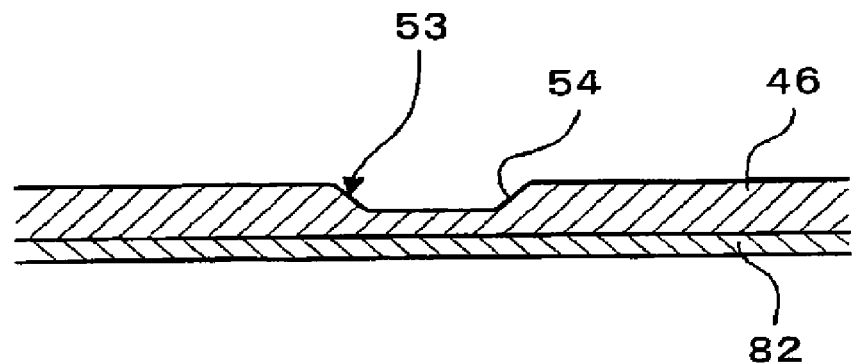
FIG. 12 shows a process for forming a conductive film during the process of manufacturing the FPC.
Figure 12:
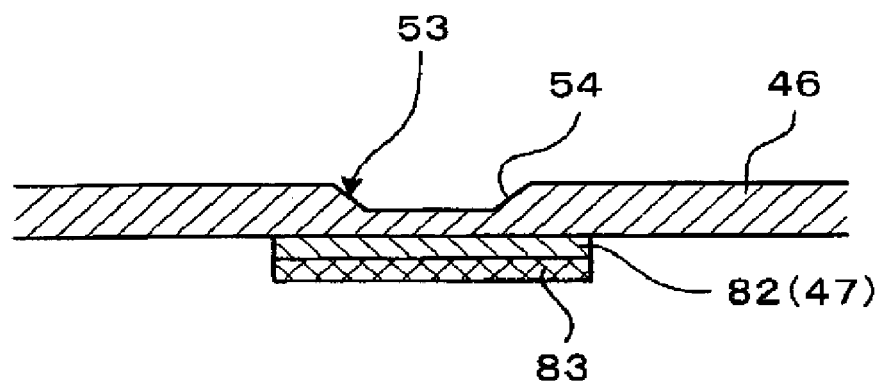
Figure 12:
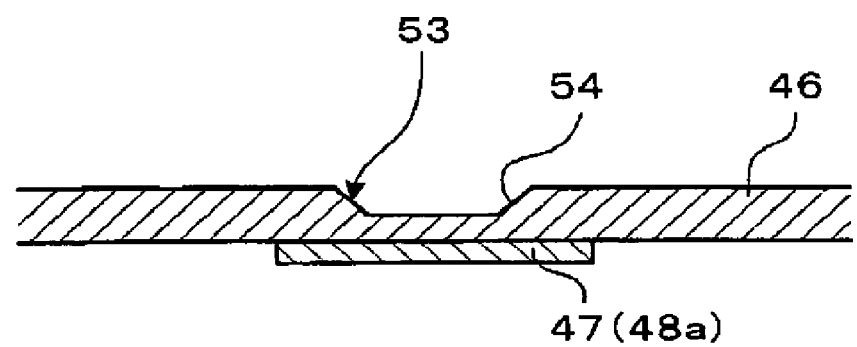

The steps (A) and (B) will be described first. FIG. 11 shows a process for forming the thinner portions during a process of manufacturing the FPC 50. FIG. 11(a) shows a state where a photo-resist 81 has been formed on the upper surface of the base film 46. FIG. 11(b) shows a state where the thinner portions 53 have been formed in the base film 46 by half etching. FIG. 11(c) shows a state where the photo-resist 81 has been removed from the base film 46. FIG. 12 shows a process for forming the conductive pattern during the process of manufacturing the FPC 50. FIG. 12(a) shows a state where copper foil 82 has been formed on the entirety of the lower surface of the base film 46. FIG. 12(b) shows a state where a photo-resist 83 has been formed on the copper foil 82 of the base film 46 and etching of the copper foil 82 has then been performed. FIG. 12(c) shows a state where the photo-resist 83 has been removed and the conductive pattern 47 has been formed on the base film 46.

In step 8 (S8) of FIG. 10, the base film 46 is prepared and, as shown in FIG. 11(a), the photo-resist 81 is patterned on the upper surface of the parts of the base film 46 that will not form the thinner portions 53. Then, in step 9 (S9), half etching is performed at the upper surface side of the base film 46, thus forming the thinner portions 53 where the thickness of the base film 46 has been reduced, as shown in FIG. 11(b). At this juncture, chemicals are used to wet etch the upper half layer of the base film 46 to form the thinner portions 53. As a result, the peripheral edges of the thinner portions 53 form the tapered faces 54 that are open in an upwards direction. Next, the photo-resist 81 is removed from the upper surface of the base film 46, as shown in FIG. 11(c).

In step 11 (S11), the copper foil 82 is bonded to the entirety of the lower surface of the base film 46 via an adhesive, as shown in FIG. 12(a). Then, in step 12 (S12) (see FIG. 12(b)), the photo-resist 83 corresponding to the conductive pattern 47 is formed on a lower face of the copper foil 82, the copper foil 82 is then etched and, with the exception of the copper foil 82 that forms the conductive pattern 47, the copper foil is removed. The conductive pattern 47 is thus formed on the lower face of the base film 46. At this juncture, the thinner portions 53 and the conductive spots 48a are formed, with the entireties of the conductive spots 48a of the conductive pattern 47 being located within the thinner portions 53. Next, in step 13 (S13), the photo-resist 83 is removed, as shown in FIG. 12(c), and metal plating (not shown) is formed on a lower face of the conductive pattern 47 by means of electroplating.

Figure 13:
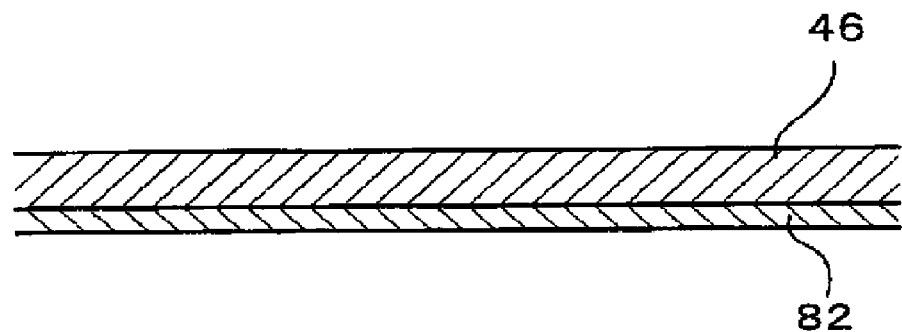
FIG. 13 shows a process for forming the conductive film during a variant process of manufacturing the FPC.
Figure 13:
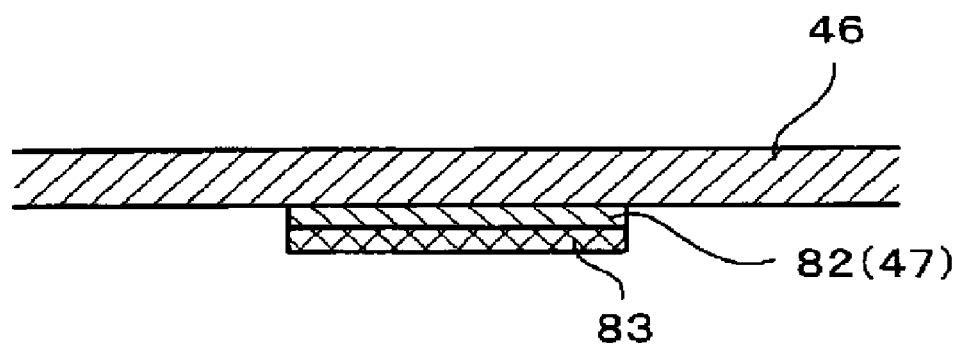
Figure 13:
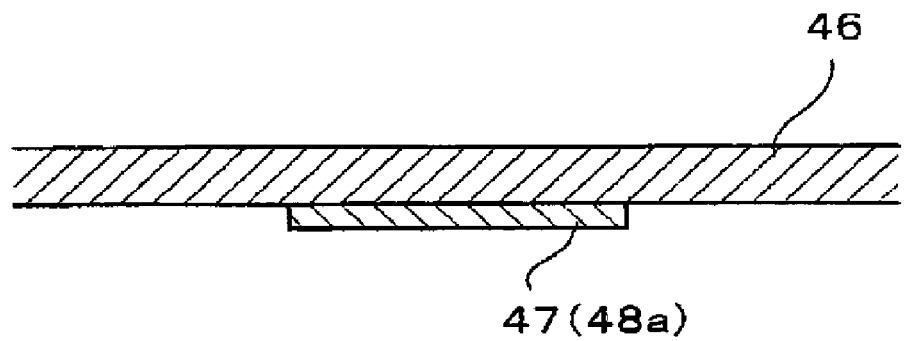
Figure 14:
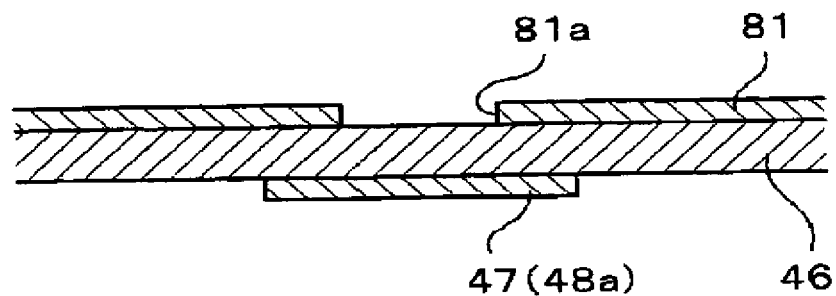
FIG. 14 shows a process for forming the thinner portions during a variant process of manufacturing the FPC.
Figure 14:
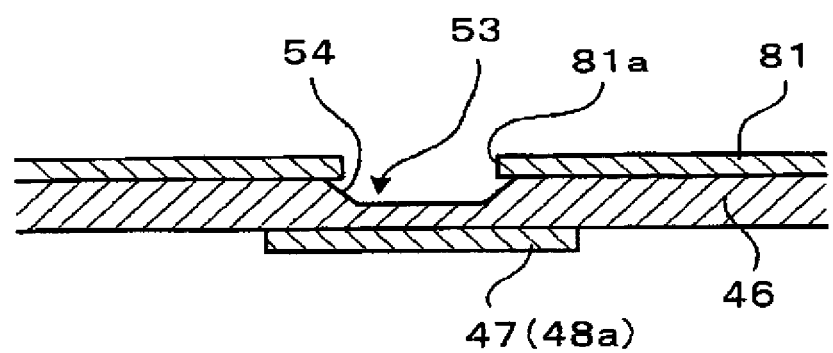
Figure 14:
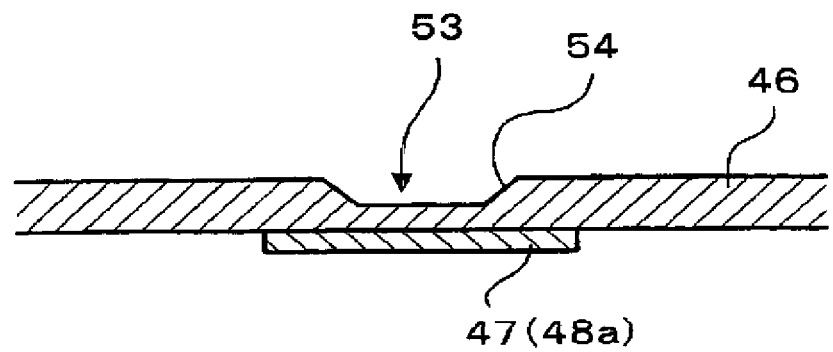

As a variant, the processes performed in steps 8~13, i.e. step (A), wherein the thinner portions 53 are formed in the base film 46, and step (B), wherein the conductive pattern 47 is formed, may be transposed in sequence. FIG. 13 shows a process for forming a conductive film during a variant process of manufacturing the FPC 50. FIG. 13(*a*) shows a state where the copper foil 82 has been formed on the entirety of the lower surface of the base film. FIG. 13(*b*) shows a state where the photo-resist 83 has been formed on the copper foil 82 of the base film 46 and etching of the copper foil 82 has then been performed. FIG. 13(*c*) shows a state where the photo-resist 83 has been removed and the conductive pattern 47 has been formed on the base film 46. FIG. 14 shows a process for forming the thinner portions. FIG. 14(*a*) shows a state where the photo-resist 81 has been formed on the upper surface of the base film 46. FIG. 14(*b*) shows a state where the thinner portions 53 have been formed in the base film 46. FIG. 14(*c*) shows a state where the photo-resist 81 has been removed from the base film 46. In these variants, the copper foil 82 is first bonded, as shown in FIG. 13(*a*), via an adhesive to the entirety of the lower surface of the base film 46 where the thinner portions 53 will not be formed (step 11). Then, as shown in FIG. 13(*b*), the photo-resist 83 is patterned on the surface of the copper foil 82 so as to form the conductive pattern 47, and the copper foil 82 is then etched. Then, with the exception of the copper foil 82 that forms the conductive pattern 47, the copper foil is removed (step 12). Next (step 13), the photo-resist 83 is removed from conductive pattern 47, as shown in FIG. 13(*c*), and gold plating (not shown) is formed on the surface of the conductive pattern 47 by means of electroplating. Then, as shown in FIG. 14(*a*), the photo-resist 81 is patterned on the upper face of the base film 46 that has the conductive pattern 47 formed thereon (step 8). At this juncture, patterning is formed so as to encompass all the conductive spots 48*a* within opening parts 81*a* of the photo-resist 81. Then, as shown in FIG. 14(*b*), half etching is performed at the base film 46, thus forming the thinner portions 53 where the thickness of the base film 46 has been reduced (step 9). Next, as shown in FIG. 14(*c*), the photo-resist 81 is removed from the upper surface of the base film 46 (step 10). In this manner, the steps 11~13 may be performed first to form the conductive pattern 47 on the base film 46, and then the steps 8~10 may be performed to form the thinner portions 53 in the base film 46.

Figure 15:
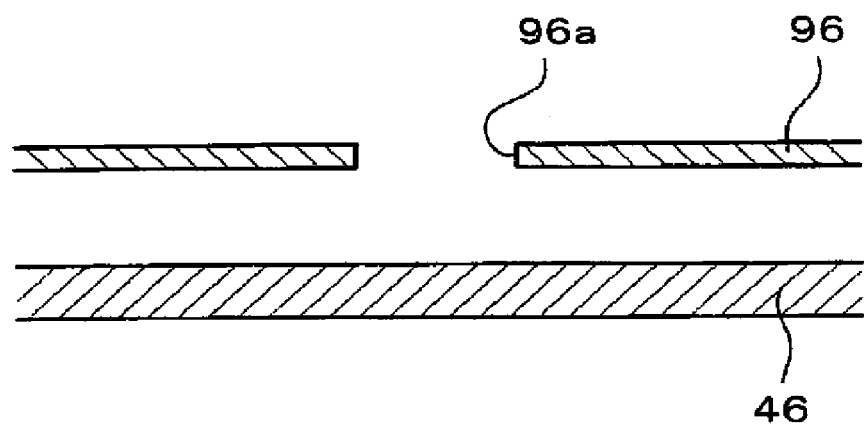
FIG. 15 shows a variant of the process for forming the thinner portions shown in FIG. 11.
Figure 15:
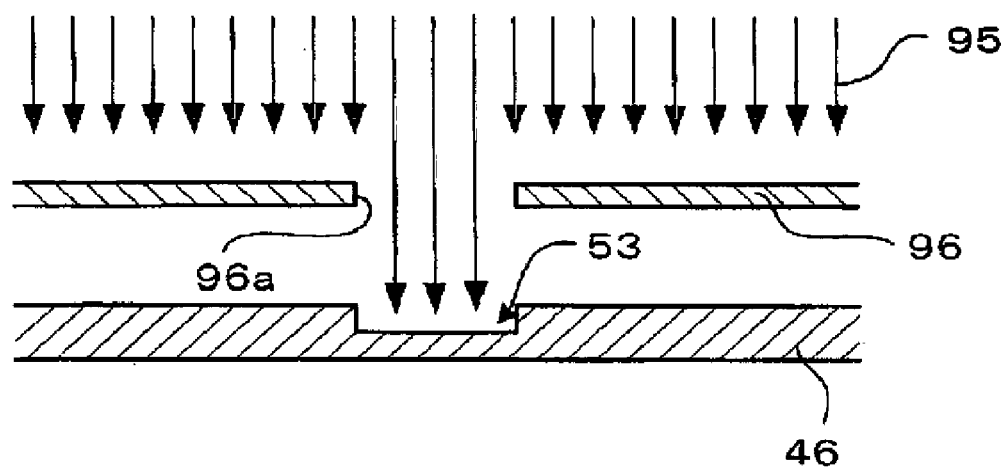

In step 9, wet etching was performed to form the thinner portions 53 in the base film 46. However, in a variant process, thinner portions 53' may be formed in the base film 46 by means of laser processing. FIG. 15 shows a variant of the process shown in FIG. 11 for forming thinner portions in the base film 46. FIG. 15(*a*) shows a state prior to the base film 46 being exposed to a laser. FIG. 15(*b*) shows a state where the base film 46 is exposed to a laser and the thinner portions 53' have been formed. First, as shown in FIG. 15(*a*), the base film 46 is prepared, and a mask 96 is disposed between the base film 46 and a laser device (not shown). Through holes 96*a* are formed in the mask 96 at locations opposite the conductive spots 48*a* of the base film 46, thus allowing these locations to be exposed to the laser. Next, as shown in FIG. 15(*b*), the base film 46 is exposed to a laser 95 via the through holes 96*a* of the mask 96, thus forming the thinner portions 53' in the base film 46. At this juncture, the base film 46 is exposed to the laser 95 for a time such that the base film 46 will not be fully penetrated (the base film 46 is exposed to the laser 95 for a time such that the base film 46 attains half its pre-exposure thickness). Peripheral walls of the thinner portions 53' that are formed in the base film 46 are formed in a direction parallel with the direction of the laser 95. Using laser processing to form the thinner portions 53' that are formed in the base film 46 allows step 8 and step 10 above (the steps of forming and removing the photo-resist 81) to be omitted. There is thus a reduction in the number of steps for forming the thinner portions 53' in the base film 46, and the time for manufacturing the ink jet head is thus reduced.

Figure 16:
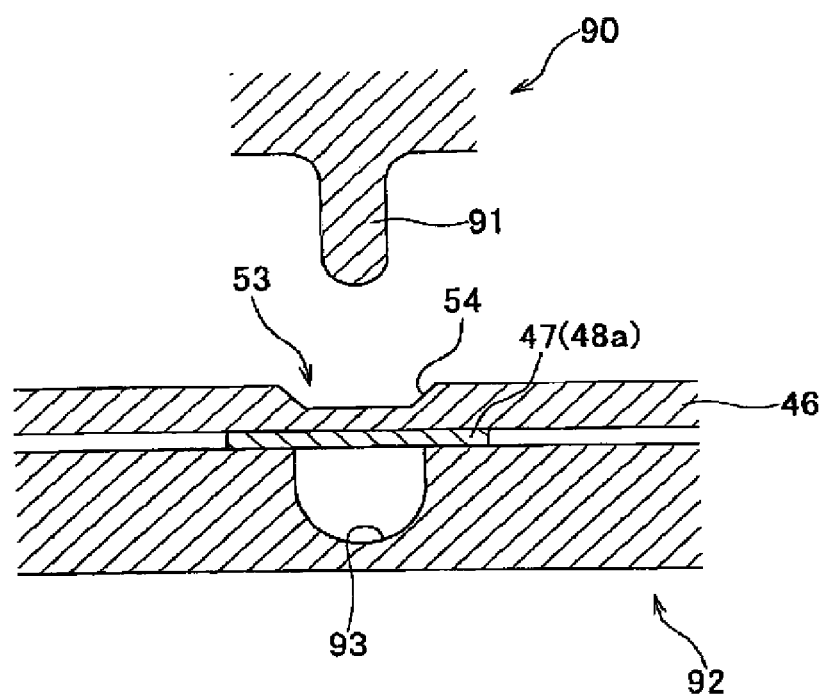
FIG. 16 shows a process for forming a projection during the process of manufacturing the FPC.
Figure 16:
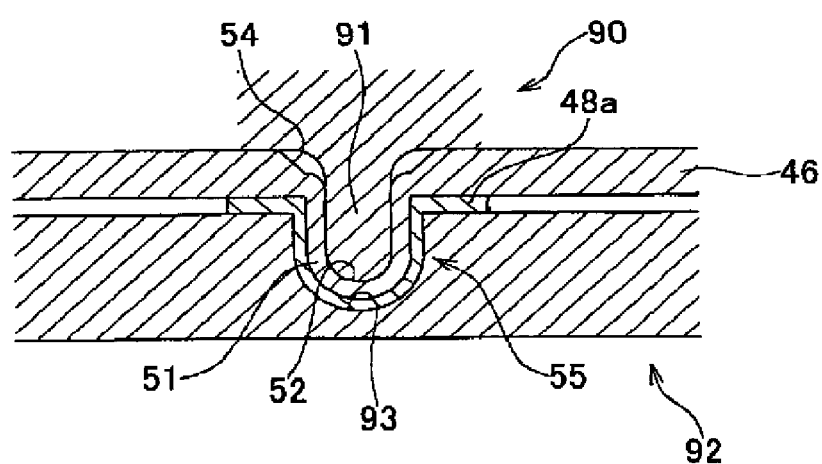
Figure 16:
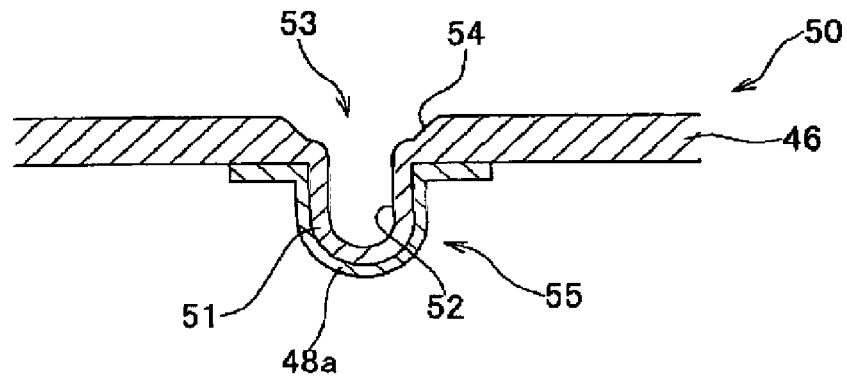

Next, the process for forming the projections 51 on the base film 46 will be described. FIG. 16 shows the process for forming the projections 51 during the process of manufacturing the FPC 50. FIG. 16(*a*) shows a state where the base film 46 has been mounted above a female mold 92. FIG. 16(*b*) shows a state where the base film 46 has been pressed by a male mold 90. FIG. 16(*c*) shows the FPC 50 that has been removed from the male and female molds.

In step 14 (S14) of FIG. 10, as shown in FIG. 16, the base film 46 that has the thinner portions 53 formed on its upper face and the conductive pattern 47 formed on its lower face is positioned above the female mold 92. The female mold 92 has hemispherical depressions 93 in locations corresponding to the conductive spots 48*a*. The male mold 90 presses the base film 46 downwards. The male mold 90 has a plurality of punches 91 at locations corresponding to the conductive spots 48*a*. The punches 91 have a thin needle shape with rounded distal ends.

In the aforementioned pressing process, the conductive spots 48*a* of the conductive pattern 47, the depressions 93, and the punches 91 are all positioned so as to be in identical, overlapping positions. Further, the conductive lines 48*b* and outer peripheral parts of the conductive spots 48*a* are disposed on the base film 46 such that they make contact with the female mold 92.

In step 15 (S15), as shown in FIG. 16(*b*), the male mold 90 is moved towards the female mold 92 (vertically downwards in FIG. 16(*b*)). The distal ends of the punches 91 of the male mold 90 make contact with approximately the center of the thinner portions 53, and are pressed towards the center of the depressions 93 of the female mold 92 from the upper face side to the lower face side of the base film 46. As a result, parts of the thinner portions 53 of the base film 46 are deformed so as to be located within the depressions 93. The pressing process performed using the male and female molds 90 and 92 causes the projections 51 and the recesses 52 to be formed in the base film 46. The protruding parts 55 are formed in the center of the conductive spots 48*a*. At least distal ends of the projections 51 are covered by the conductive spots 48*a*. The degree of pressing at this juncture, i.e. the degree to which the male mold 90 moves towards the female mold 92, corresponds to the degree by which the distal ends of the protruding parts 55 of the conductive spots 48*a* (these having been deformed by the punches 91) move towards the center of the depressions 93. The degree of pressing is adjusted so that the entirety of the projections 51 of the base film 46 is located within the thinner portions 53.

In step 16 (S16), as shown in FIG. 16(*c*), the base film 46 is removed from the male and female molds 90 and 92, thereby completing the manufacture of the FPC 50 that has the protruding parts 55 formed on the conductive spots 48*a*. The protruding parts 55 have natural shapes projecting downwardly.

Figure 17:
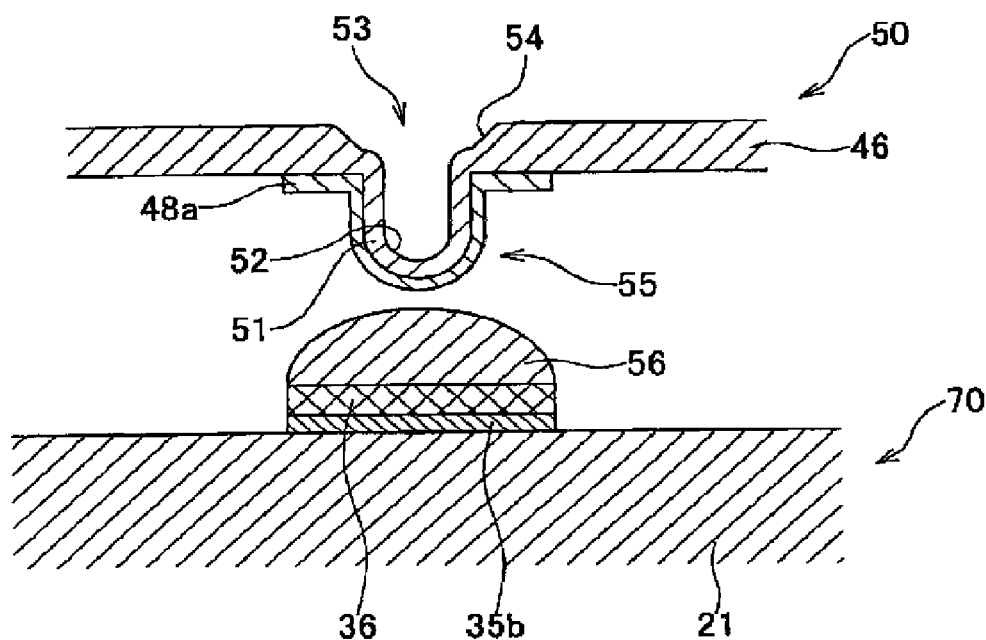
FIG. 17 shows a process for connecting the FPC and the actuator unit.
Figure 17:
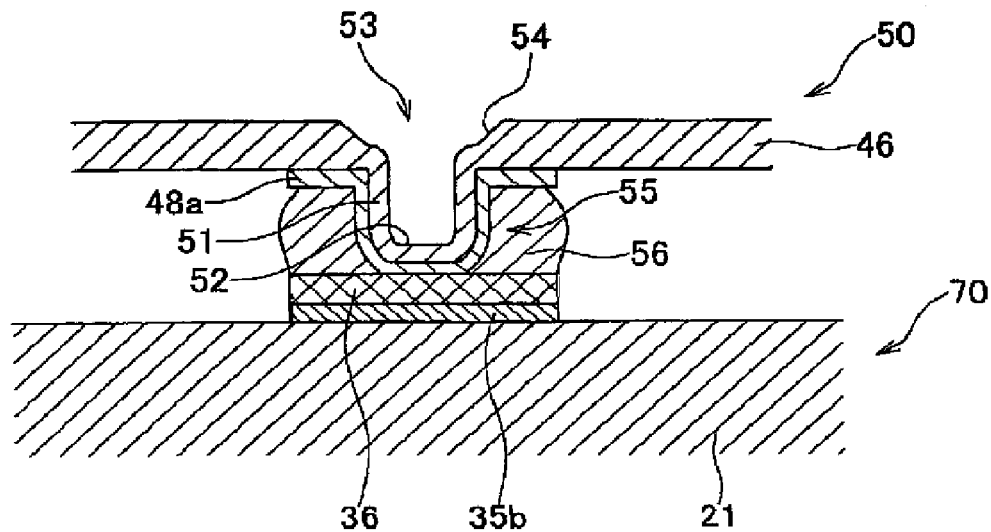

Finally, a process for connecting the FPC 50 to the actuator unit 21 will be described. FIG. 17 shows the process for connecting the FPC 50 and the actuator unit 21. FIG. 17(*a*) shows a state where the protruding parts 55 of the conductive spots 48*a* are disposed opposite the lands 36 of the actuator unit 21. FIG. 17(*b*) shows a state where the conductive spots 48a have been joined with the lands 36. In step 17 (S17) of FIG. 10, as shown in FIG. 17(a), the epoxy thermosetting adhesive 56 is first disposed on the lands 36, and then the FPC 50 is disposed on the actuator unit 21 such that the lands 36 of the individual electrodes 35 are opposite the protruding parts 55 of the conductive spots 48a.

Next, in step 18 (S18), as shown in FIG. 17(b), the head main body 70 and the FPC 50 are heated temporarily while the distal ends of the protruding parts 55 are being pressed against the lands 36 and are being deformed resiliently from the natural shapes, and the adhesive 56 is caused to harden temporarily, thus temporarily joining the head main body 70 and the FPC 50. In the present form of the embodiment, the lands 36 and the conductive spots 48a are covered with gold (not shown), and therefore an oxidized layer is not formed between the lands 36 and the conductive spots 48a. Electrical connection is thus made more reliable. The step of pressing the FPC 50 against the actuator unit 21 is then halted, heat is again applied to the head main body 70 and the FPC 50 that have been temporarily joined, the adhesive 56 is further hardened, and the head main body 70 and the FPC 50 are thus joined. At this juncture, resilient returning force operates at the protruding parts 55 of the conductive spots 48a for causing them to return to their original shape. However, the contractive force of the adhesive 56 is greater than the resilient returning force of the protruding parts 55, and consequently the FPC 50 is joined with the head main body 70 in a state where the distal ends of the protruding parts 55 make contact with and are crushed against the lands 36 of the individual electrodes 35. The protruding parts 55 are deformed from the natural shapes to tightly contact the lands 36. The distal ends of the protruding parts 55 are firmly pressed against the lands 36 by resilient force operating at the protruding parts 55.

Next, the protecting plate 44 is connected to the upper surface of the FPC 50 (see FIG. 2). A fixing process is then performed to fix the head main body 70, the reinforcing sheet 41, and the ink tank 71 such that the ink discharge ports 2M, 2Y, 2C, and 2K, the through holes 41M, 41Y, 41C, and 41K, and the ink inlet ports 4M, 4Y, 4C, and 4K are positioned so as to mutually join. Thereupon, these are housed within and fixed to the holder 72. Furthermore, the ink jet head 1 is completed by performing the processes of forming the resilient member 74 and the heat sink 76. Moreover, the FPC 50 is fixed to the IC 75 during manufacture.

The steps of manufacturing the FPC 50 in step 8~step 16 may be performed in parallel with the steps of manufacturing the head main body 70 (step 1~step 7) or in parallel with the steps of manufacturing the passage unit 4 and the actuator unit 21, or may be performed prior to the steps of manufacturing the head main body 70. Further, it is also possible that, before the passage unit 4 and the actuator unit 21 are joined, the actuator unit 21 and the FPC 50 are joined temporarily in step 18, and then the actuator unit 21 and the passage unit 4 are positioned so as to overlap. The FPC 50, the actuator unit 21, and the passage unit 4 are then heated, the actuator unit 21 and the passage unit 4 are joined to manufacture the head main body 70, and the FPC 50 and the head main body 70 are joined. In this manner, the second heating process of step 16 can be included within the first heating process of step 6, thus allowing a reduction in the number of heating processes. The number of manufacturing steps can thus be reduced.

In the aforementioned method of manufacturing the FPC 50 of the ink jet head 1, the projections 51 of the base film 46 are formed in the thinner portions 53. As a result, the thickness of the projections 51 can be reduced, and the plane size of the projections 51 is small. Moreover, the area of the base film 46 surrounding the thinner portions 53 is thicker than the thinner portions 53. The strength of the FPC 50 is thus maintained, and the FPC 50 can be handled easily. There is no unintended bending of the FPC 50 at the time when the conductive spots 48a of the FPC 50 are disposed opposite the lands 36, and the FPC 50 can thus be handled easily. As a result, the projections 51 which have a small plane size can be formed with a high density on the FPC 50 without causing any deterioration in the handling of the FPC 50. When an ink jet head 1 using this type of FPC 50 is manufactured, the ink jet head 1 can be manufactured easily. The FPC 50 has a certain degree of strength, and therefore it is easy to match the positions of the conductive spots 48a of the FPC 50 with the positions of the lands 36.

The thinner portions 53 are formed by a removal process, i.e. half etching the face opposite the face having the conductive spots 48a of the base film 46. Consequently, in the process of forming the projections 51 of the base film 46, only a small pressing force is required to form the projections 51. The pressing force therefore does not apply excessive stress to the conductive spots 48a, and consequently the conductive spots 48a do not readily peel off. Further, the thinner portions 53 are formed by half etching, in which chemicals are used to erode the thinner portions 53. Consequently, the peripheral edges of the thinner portions 53 form the tapered faces 54. As a result, in the case where the distal ends of the punches 91 of the male mold 90 are located opposite the tapered faces 54 when the projections 51 and recesses 52 are to be formed in the thinner portions 53, the tapered faces 54 guide the distal ends of these punches 91 to the center of the thinner portions 53. The position at which the projections 51 are formed is thus located more accurately. Further, the projections 51 of the base film 46 are formed within the thinner portions 53, and therefore the projections 51 are thinner. As a result, the plane size of the projections 51 becomes smaller, and consequently the projections 51 can be distributed with a higher density on the FPC 50. Further, the conductive pattern 47 is formed by etching the copper foil 82 at the lower face of the base film 46, and consequently the conductive spots 48a and the conductive lines 48b are formed simultaneously on the same plane. A separate process for manufacturing the conductive lines 48b is therefore no longer required, and the number of manufacturing steps can thus be reduced.

Further, in the FPC 50 of the ink jet head 1, the projections 51 of the base film 46 are formed within the thinner portions 53, and therefore the projections 51 are thinner and consequently have greater flexibility. That is, the protruding parts 55 of the conductive spots 48a of the FPC 50 of the present embodiment are capable of being deformed resiliently, and consequently even if there is unevenness among the heights of the projections 51 of the FPC 50 or among the heights of the contacts of the actuator 21, this unevenness in height can be accommodated by the flexible projections 51. The ink jet head thus has a more reliable electrical connection between the FPC 50 and the actuator 21. Further, the projections 51 are located entirely within the thinner portions 53, and consequently the projections 51 have greater flexibility and can easily accommodate differences in height of the protruding parts 55 and/or the lands 36.

A preferred form to represent the present invention was described above. However, the present invention is not restricted to the form described above, and various changes may be made without departing from the scope of the claims. For example, the thinner portions 53 and 53' of the FPC 50 described above were formed by wet etching and by laser processing respectively. However, the base film 46 may equally well be peeled away by means of a mechanical process. Further, the thinner portions may be formed by performing wet etching of both faces (the upper face and the lower face) of the base film 46. Alternatively, the thinner portions may be formed by means of dry etching.

In the FPC 50 of the present form of the embodiment, the projections 51 have a height that corresponds approximately with the depth of the depressions 93 of the female mold 92. However, the projections 51 can have a height smaller or greater than the depth of the depressions 93. This height can be varied easily by adjusting the degree of movement of the punches 91. Furthermore, the projections 51 may equally well not be located within the thinner portions 53 from a plan view. Further, the conductive spots 48a may equally well be located within the thinner portions 53 from a plan view. In this case, there will be a wider space between each of the plurality of conductive spots 48a, and short circuiting of the conductive spots 48a can thus be reduced. The conductive spots 48a may equally well be disposed so as to cover only the distal ends of the projections 51. The conductive lines 48b may equally well not be formed on the base film 46 in the direction in which the FPC 50 extends, but may instead be disposed so as to be electrically connected with the conductive spots 48a by being passed along through holes that penetrate to the upper face side of the base film 46.

In the FPC 50 of the present form of the present embodiment, the FPC 50 need not be joined with the head main body 70 while the protruding parts 55 are in contact with and are crushed against the lands 36. Instead, the distal ends of the protruding parts 55 may equally well simply make contact with the surface faces of the lands 36. Further, a minute quantity of solder may be present between the lands 36 and the distal ends of the protruding parts 55 of the conductive spots 48a. The solder thus joins the conductive spots 48a and the lands 36 by means of cohesion, and the electrical connection between the two therefore becomes more reliable.

In the present embodiment it is preferred that, in the step of forming the thinner portions, these thinner portions are formed by performing a removal process on a second face of the flexible layer. This second face refers to a face at the opposite side from a first face on which the conductive spots are formed. Excessive stress is therefore not applied to a conductive layer when pressing force is being applied to the flexible layer, and consequently the conductive layer does not readily peel off.

In the present embodiment it is preferred that, in the step of forming the thinner portions, these thinner portions are formed by performing etching from the second face of the flexible layer. Peripheral edges of the thinner portions therefore form tapered faces that are open to the exterior. As a result, when the projections are formed by pressing the thinner portions, the tapered faces guide a pressing member to a center of the thinner portions. The position at which the projections are formed is thus located more accurately.

In the present embodiment it is preferred that, in the step of forming the thinner portions, the thinner portions are formed by exposing the second face of the flexible layer to a laser. Manufacturing time is thus decreased.

In the present embodiment it is preferred that, in the step of forming the projections, a degree of pressing is adjusted so that the entirety of each projection remains within each of the thinner portions. It is thus possible to form projections that have a smaller plane size and are formed with a higher density.

In the step of forming the conductive spots it is preferred in the present embodiment that the conductive spots and the conductive lines—one of each of the conductive lines being connected to one of each of the conductive spots—are formed simultaneously on the first face of the flexible layer. The number of steps can thus be reduced.

In the present embodiment it is preferred that the entirety of the projections is located within the thinner portions. It is thus easier to absorb differences in height between the plurality of projections and/or joining members.

In the present embodiment, the connector (in the present representative embodiment, this is the FPC 50 using the flexible base film) that is connected with and supplies driving power to the electric device (in the present representative embodiment, this is the actuator unit 21) need not be flexible. As long as the connector is fixed to the electric device, the connector may equally well be rigid. The protruding conductive spots may be formed by pressing even if a rigid base plate is used.

What is claimed is:

1. An ink jet printer comprising:
 a piezo-electric actuator having a piezo-electric layer and a plurality of contacts distributed on a surface of the piezo-electric layer; and
 a flat connector having:
  a sheet made of an insulating material, a plurality of projections being formed at a first surface of the sheet and a plurality of recesses corresponding to the projections being formed at a second surface of the sheet, and a plurality of conductive lines and a plurality of conductive spots, the conductive spots being formed on the first surface of the sheet, one of each of the conductive lines being connected to one of each of the conductive spots, each of the conductive spots covering at least a distal end of each of the projections, wherein portions of the sheet forming the distal ends of the projections are located within portions thinner than an area surrounding the thinner portions,
 wherein the piezo-electric actuator and the flat connector are fixed such that each of the projections of the flat connector makes contact with each of the contacts of the piezo-electric actuator.

2. An ink jet printer of claim 1, the distal ends of the projections are pressed against the contacts by resilient force operating at the projections.

3. An ink jet printer of claim 1, wherein the flat connector is flexible.

* * * * *

UNITED STATES PATENT AND TRADEMARK OFFICE
CERTIFICATE OF CORRECTION

PATENT NO.       : 7,320,603 B2
APPLICATION NO.  : 11/674181
DATED            : January 22, 2008
INVENTOR(S)      : Koji Nakayama Page 1 of 1

It is certified that error appears in the above-identified patent and that said Letters Patent is hereby corrected as shown below:

On the Title Page, Item (56) References Cited:
 Please delete "5,992,976" and insert --5,992,996--.

Signed and Sealed this

Sixth Day of January, 2009

JON W. DUDAS
*Director of the United States Patent and Trademark Office*